(12) United States Patent
Muto et al.

(10) Patent No.: US 10,573,604 B2
(45) Date of Patent: *Feb. 25, 2020

(54) SEMICONDUCTOR DEVICE

(71) Applicant: Renesas Electronics Corporation, Tokyo (JP)

(72) Inventors: Kuniharu Muto, Tokyo (JP); Ryo Kanda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/151,585

(22) Filed: Oct. 4, 2018

(65) Prior Publication Data

US 2019/0035745 A1 Jan. 31, 2019

Related U.S. Application Data

(63) Continuation of application No. 15/833,289, filed on Dec. 6, 2017, now Pat. No. 10,128,200.

(30) Foreign Application Priority Data

Dec. 28, 2016 (JP) ................................ 2016-254678

(51) Int. Cl.
*H01L 23/495* (2006.01)
*H01L 23/00* (2006.01)
(Continued)

(52) U.S. Cl.
CPC ........ *H01L 23/562* (2013.01); *H01L 21/4825* (2013.01); *H01L 21/4842* (2013.01);
(Continued)

(58) Field of Classification Search
CPC .......... H01L 23/49513; H01L 23/4952; H01L 23/49531; H01L 23/49562;
(Continued)

(56) References Cited

U.S. PATENT DOCUMENTS 9,275,930 B2 3/2016 Mashimo et al.
10,128,200 B2* 11/2018 Muto .................... H01L 23/495
(Continued)

FOREIGN PATENT DOCUMENTS

JP 2004-15946 A 1/2004
JP 2012-69764 A 4/2012

OTHER PUBLICATIONS

Extended European Search Report received in corresponding European Application No. 17203604.8 dated May 15, 2018.

*Primary Examiner* — Cuong Q Nguyen
(74) *Attorney, Agent, or Firm* — Mattingly & Malur, PC

(57) ABSTRACT

A semiconductor device includes a first and second semiconductor chips, a resistive component, and a semiconductor chip including a first circuit coupled to electrodes on both ends of the resistive component. A sealing body has a first long side, a second side, a third short side, and a fourth short side. In a Y-direction, each of the first and second semiconductor chips is disposed at a position closer to the first side than to the second side, while the semiconductor chip is disposed at a position closer to the second side than to the first side. Also, in the Y-direction, the resistive component, the second semiconductor chips, and the first semiconductor chips are arranged in order of increasing distance from the third side toward the fourth side, while the semiconductor chip is disposed at a position closer to the third side than to the fourth side.

5 Claims, 24 Drawing Sheets

(51) Int. Cl.
*H01L 23/31* (2006.01)
*H01L 21/48* (2006.01)
*H01L 21/56* (2006.01)
*H01L 23/544* (2006.01)
*H01L 21/78* (2006.01)
*H02M 7/5387* (2007.01)
*H02P 27/06* (2006.01)
*H02M 7/00* (2006.01)
*H02M 1/00* (2006.01)

(52) U.S. Cl.
CPC ............ *H01L 21/565* (2013.01); *H01L 21/78* (2013.01); *H01L 23/3114* (2013.01); *H01L 23/495* (2013.01); *H01L 23/4952* (2013.01); *H01L 23/49513* (2013.01); *H01L 23/49531* (2013.01); *H01L 23/49562* (2013.01); *H01L 23/49575* (2013.01); *H01L 23/544* (2013.01); *H01L 24/48* (2013.01); *H02M 7/5387* (2013.01); *H01L 24/45* (2013.01); *H01L 2223/54486* (2013.01); *H01L 2224/0603* (2013.01); *H01L 2224/32245* (2013.01); *H01L 2224/45124* (2013.01); *H01L 2224/45144* (2013.01); *H01L 2224/45147* (2013.01); *H01L 2224/48137* (2013.01); *H01L 2224/48139* (2013.01); *H01L 2224/48155* (2013.01); *H01L 2224/48245* (2013.01); *H01L 2224/4903* (2013.01); *H01L 2224/73265* (2013.01); *H01L 2924/1203* (2013.01); *H01L 2924/13055* (2013.01); *H01L 2924/13091* (2013.01); *H01L 2924/14252* (2013.01); *H01L 2924/19043* (2013.01); *H01L 2924/19105* (2013.01); *H01L 2924/351* (2013.01); *H02M 7/003* (2013.01); *H02M 2001/0009* (2013.01); *H02P 27/06* (2013.01)

(58) Field of Classification Search
CPC ............ H01L 23/49575; H01L 23/544; H01L 23/562; H01L 24/46; H01L 24/48
See application file for complete search history.

(56) References Cited

U.S. PATENT DOCUMENTS

2015/0042373 A1 2/2015 Nakamura
2017/0033035 A1 2/2017 Sato

* cited by examiner

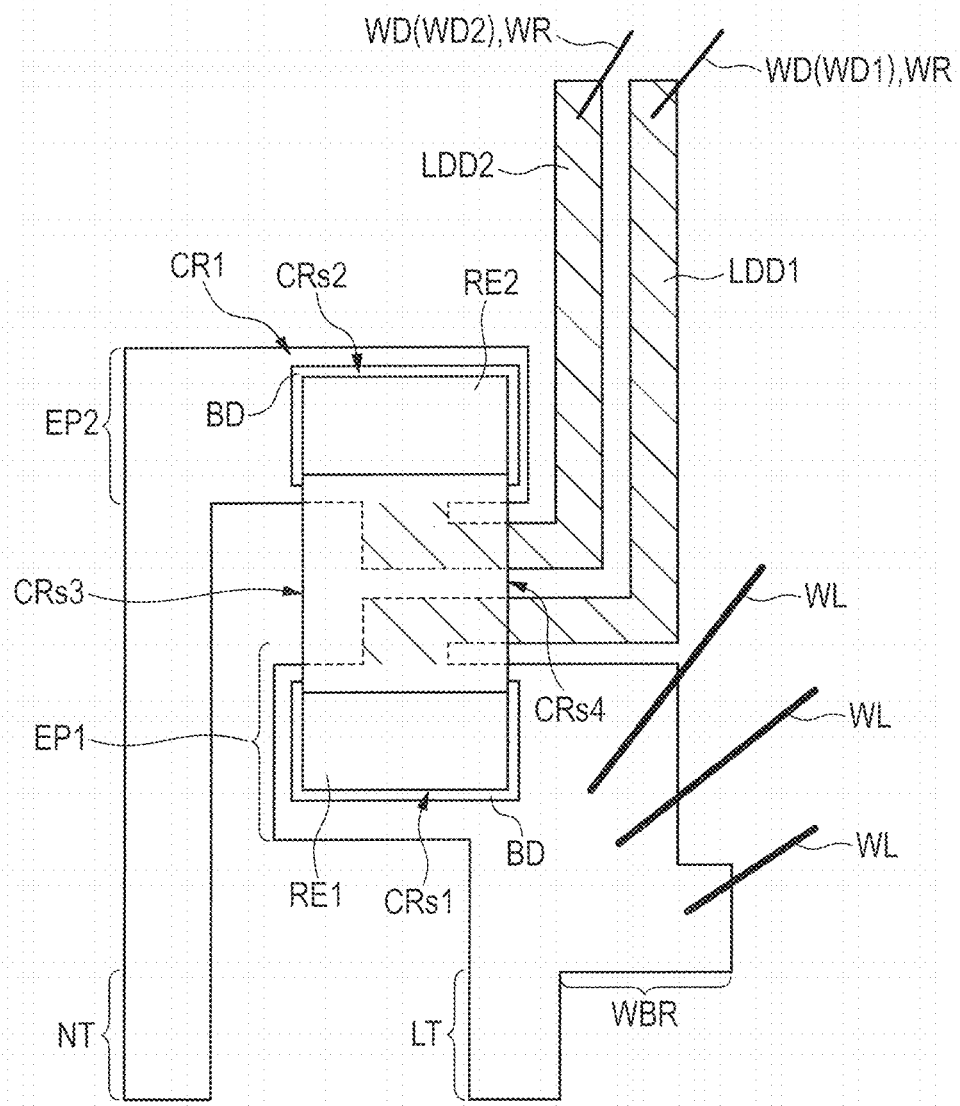
FIG. 25
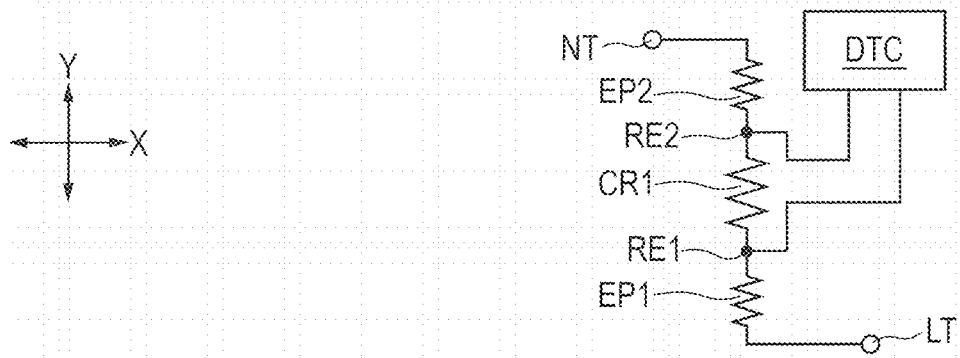

SEMICONDUCTOR DEVICE

CROSS-REFERENCE TO RELATED APPLICATIONS

This application is a continuation application of U.S. Ser. No. 15/833,289, filed Dec. 6, 2017, which is the disclosure of Japanese Patent Application No. 2016-254678 filed on Dec. 28, 2016 including the specification, drawings and abstract is incorporated herein by reference in its entirety.

BACKGROUND

The present invention relates to a semiconductor device and relates to, for example, a semiconductor device in which a plurality of electronic components including semiconductor chips each having a power transistor are contained in a single package.

Each of Japanese Unexamined Patent Application Publication No. 2004-15946 (Patent Document 1) and Japanese Unexamined Patent Application Publication No. 2012-69764 (Patent Document 2) describes a semiconductor device in which switching elements included in an inverter circuit and a shunt resistor are contained in a single package.

RELATED ART DOCUMENTS

Patent Documents

[Patent Document 1] Japanese Unexamined Patent Application Publication No. 2004-15946

[Patent Document 2] Japanese Unexamined Patent Application Publication No. 2012-69764

SUMMARY

In each of power supply systems which drive an air-conditioning device, an automobile, various industrial devices, and the like, a power conversion circuit such as an inverter circuit is embedded. Examples of a configuration of the power conversion circuit include an electronic device (power conversion device or semiconductor module) in which a plurality of semiconductor chips having transistors (power transistors) each operating as a switching element are mounted in a single substrate and electrically coupled to each other.

The present inventors have studied to improve the performance of a semiconductor device including a so-called power-system circuit, such as the power conversion circuit described above, and found an improvement. For example, it can be considered to use a method in which, in order to inhibit an erroneous operation of the power conversion circuit, the value of a current flowing in the power conversion circuit or the like is measured and, on the basis of the measurement result, the operation of the circuit is controlled. In this case, it is necessary to improve measurement accuracy.

Other problems and novel features of the present invention will become apparent from a statement in the present specification and the accompanying drawings.

A semiconductor device according to an embodiment includes a plurality of first semiconductor chips each including a first power transistor, a plurality of second semiconductor chips each including a second power transistor, a resistive component electrically coupled to the foregoing second power transistors, and a third semiconductor chip including a first circuit coupled to electrodes on both ends of the foregoing resistive component. A sealing body sealing therein the foregoing plurality of first semiconductor chips, the foregoing plurality of second semiconductor chips, and the foregoing third semiconductor chip has a first long side extending in a first direction, a second long side opposite to the foregoing first long side, a first short side extending in a second direction crossing the foregoing first direction, and a second short side opposite to the foregoing first short side. In the foregoing second direction, each of the foregoing plurality of first semiconductor chips and the foregoing plurality of second semiconductor chips is disposed at a position closer to the foregoing first long side of the foregoing sealing body than to the foregoing second long side thereof, while the foregoing third semiconductor chip is disposed at a position closer to the foregoing second long side of the foregoing sealing body than to the foregoing first long side thereof. In the foregoing first direction, the foregoing resistive component, the foregoing plurality of second semiconductor chips, and the plurality of first semiconductor chips are arranged in order of increasing distance from the foregoing first short side of the foregoing sealing body toward the foregoing second short side thereof, while the foregoing third semiconductor chip is disposed at a position closer to the foregoing first short side than to the foregoing second short side.

The foregoing embodiment allows the performance of the semiconductor device to be improved.

BRIEF DESCRIPTION OF THE DRAWINGS

FIG. 25 is an enlarged plan view showing a modification of FIG. 15; and

DETAILED DESCRIPTION

Figure 1:
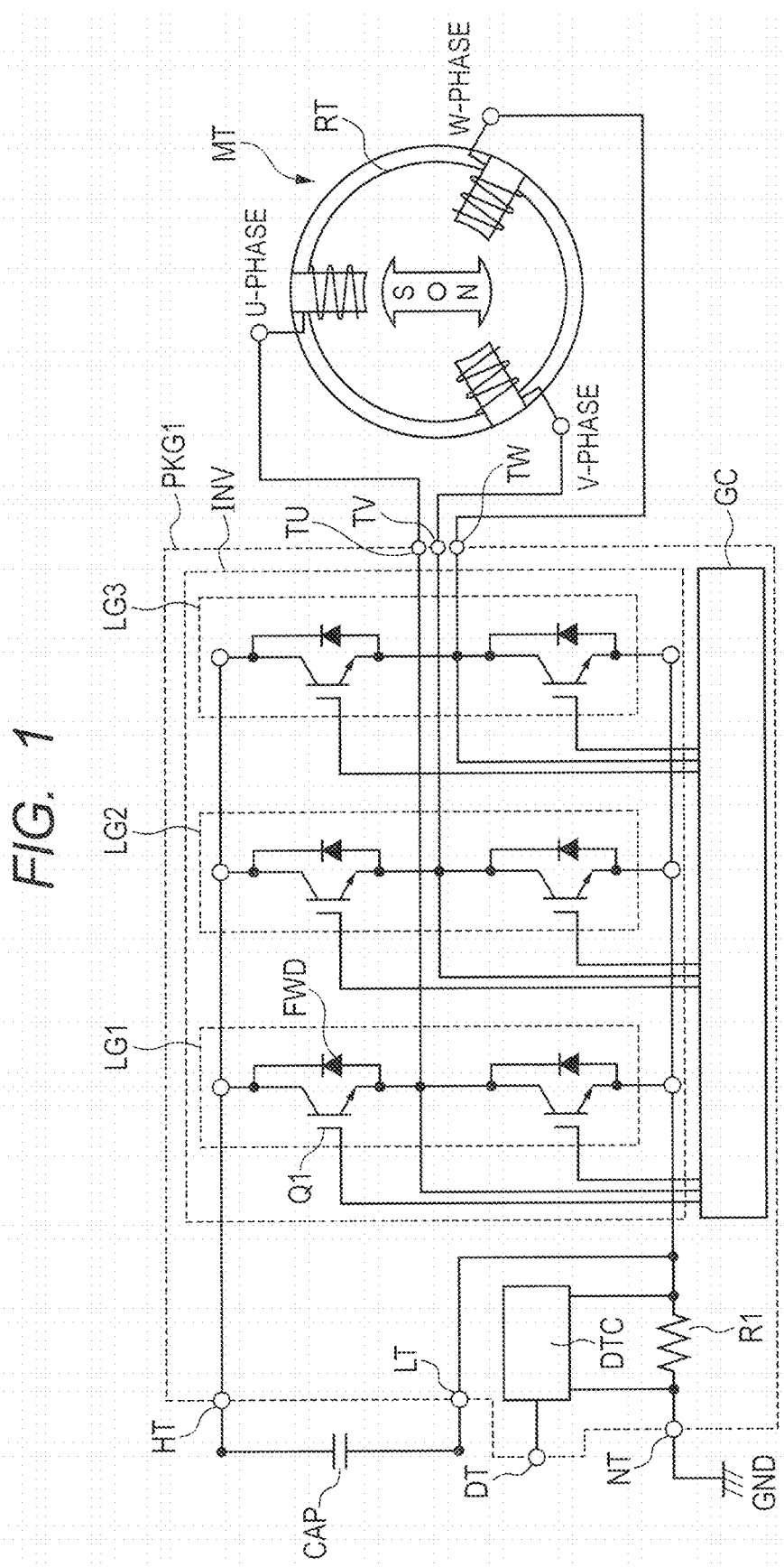
FIG. 1 is a circuit diagram showing a configuration of an inverter circuit and a motor circuit including a 3-phase induction motor in an embodiment.

Explanation of Description Form, Basic Terminology, and Use Thereof in Present Invention In the present invention, if necessary for the sake of convenience, an embodiment will be described by being divided into a plurality of sections or the like. However, they are by no means independent of or distinct from each other unless particularly explicitly described otherwise, and one of the individual parts of a single example is details, modifications, and so forth of part or the whole of the others irrespective the order in which they are described. In principle, a repetitive description of like parts will be omitted. Also, each component in the embodiment is not indispensable unless particularly explicitly described otherwise, unless the component is theoretically limited to a specific number, or unless it is obvious from the context that the component is indispensable.

Likewise, even when such wording as "X comprised of A" is used in association with a material, a composition, or the like in the description of the embodiment or the like, it is not intended to exclude a material, a composition, or the like which contains an element other than "A" unless particularly explicitly described otherwise or unless it is obvious from the context that it excludes such a material, a composition, or the like. For example, when a component is mentioned, the wording means "X containing A as a main component" or the like. It will be appreciated that, even when a "silicon member" or the like is mentioned, it is not limited to pure silicon, and a member containing a SiGe (silicon germanium) alloy, another multi-element alloy containing silicon as a main component, another additive, or the like is also included. Additionally, even when a gold plating, a Cu layer, a nickel plating, or the like is mentioned, it is assumed to include not only a pure gold plating, a pure Cu layer, a pure nickel plating, or the like, but also a member containing gold, Cu, nickel, or the like as a main component unless it is particularly explicitly described otherwise.

Further, when a specific numerical value or numerical amount is mentioned, it may be either more or less than the specific numerical value unless particularly explicitly described otherwise, unless the numerical value or numerical amount is theoretically limited to the number, or unless it is obvious from the context that the numeral value or numerical amount is limited to the number.

In the individual drawings for the embodiment, the same or like parts are designated by the same or similar symbols or reference numerals, and the description thereof will not be repeated in principle.

In the accompanying drawings, hatching or the like may be omitted even in a cross section when hatching or the like results in complicated illustration or when the distinction between a portion to be hatched and a vacant space is distinct. In relation thereto, even when a hole is two-dimensionally closed, the background outline thereof may be omitted when it is obvious from the description or the like that the hole is two-dimensionally closed, and so forth. On the other hand, even though not shown in a cross section, a portion other than a vacant space may be hatched with lines or dots to clearly show that the hatched portion is not a vacant space or clearly show the boundary of a region.

In the present specification, an "electronic component" means a component using electrons. In particular, a component using electrons in a semiconductor is a "semiconductor component". Examples of the "semiconductor component" include a semiconductor chip. Accordingly, the term "semiconductor component" includes the "semiconductor chip", and a higher-level concept of the "semiconductor component" is the "electronic component".

Also, in the present specification, a "semiconductor device" means a structure which includes a semiconductor component and an external coupling terminal electrically coupled to the semiconductor component and in which the semiconductor component is covered with a sealing body. In particular, the "semiconductor device" is configured to be electrically coupleable to an external device via the external coupling terminal.

Also, in the present specification, a "power transistor" is a collection of a plurality of (e.g., several to tens of thousands of) unit transistors (cell transistors) which are coupled in parallel to each other to implement the function of each of the unit transistors even with a current higher than a maximum allowable current for the unit transistor. For example, when the unit transistor functions as a switching element, the "power transistor" serves as a switching element which can be used appropriately even with a current higher than the maximum allowable current for the unit transistor. Examples of the "power transistor" included in the switching element include an IGBT (Insulated Gate Bipolar Transistor) and a power MOSFET (Metal Oxide Semiconductor Field Effect Transistor). In the present specification, the term "power transistor" is used to show an upper-level concept including both the "power MOSFET" and the "IGBT". A semiconductor chip including a power transistor may be referred to also as a power semiconductor chip.

Embodiment

In the present embodiment, as an example of a semiconductor device in which a plurality of electronic components including semiconductor chips each having a power transistor are contained in a single package, a power conversion device as a semiconductor package (semiconductor device) including an inverter circuit (power conversion circuit) will be described. Also, in the present embodiment, an example using an IGBT as a power transistor will be described.

An inverter circuit converts DC power to AC power. For example, when a direct current supply alternately produces positive/negative outputs, the direction of a current is reversed in response thereto. In this case, since the direction of the current is alternately reversed, the outputs can be considered to be AC power. This is the principle of the inverter circuit. The AC power mentioned herein comes in various forms represented by single-phase AC power and 3-phase AC power. By way of example, the present embodiment will describe a 3-phase inverter circuit which converts DC power to 3-phase AC power. However, the target to which a technical idea in the present embodiment is applied is not limited to the 3-phase inverter circuit. The technical idea in the present embodiment is widely applicable to, e.g., a single-phase inverter circuit or the like.

<Example of Configuration of 3-Phase Inverter>

FIG. 1 is a circuit diagram showing a configuration of a motor circuit including an inverter circuit and a 3-phase induction motor in the present embodiment. In FIG. 1, the motor circuit has a 3-phase induction motor MT and an inverter circuit INV. The 3-phase induction motor MT is configured to be driven with voltages in three different phases. Specifically, in the 3-phase induction motor MT, a rotating magnetic field is generated around a rotor RT as a conductor using a 3-phase alternating current having three phases referred to as a U-phase, a V-phase, and a W-phase which are 120 degrees out of phase. In this case, the magnetic field rotates around the rotor RT. This means that a magnetic flux traversing the rotor RT as the conductor changes. As a result, electromagnetic induction occurs in the rotor RT as the conductor so that an induction current flows in the rotor RT. The induction current flowing in the rotating magnetic field means that a force is applied to the rotor RT in accordance with the Fleming's left hand rule, and the rotor RT is rotated by the force. It can be seen that, thus, in the 3-phase induction motor MT, by using the 3-phase alternating current, the rotor RT can be rotated. That is, the 3-phase induction motor MT needs the 3-phase alternating current. Accordingly, in the motor circuit, by using the inverter circuit INV which generates the alternating current from a direct current, AC power is supplied to the induction motor. In the present embodiment, three types of AC powers (in U-, V- and W-phases) are generated by the single inverter circuit INV and supplied to the 3-phase induction motor.

The following will describe an example of a configuration of the inverter circuit INV. As shown in FIG. 1, in the inverter circuit INV in the present embodiment, e.g., transistors (which are IGBTs in the example shown in FIG. 1) Q1 and diodes FWD are provided to correspond to the three phases. Each of the switching elements included in the inverter circuit IVN in the present embodiment is formed of a component in which the transistor Q1 and the diode FWD are coupled in antiparallel to each other. In other words, each of upper and lower arms in a leg LG1, upper and lower arms in a leg LG2, and upper and lower arms in a leg LG3 which are shown in FIG. 1 is formed of the component in which the transistor Q1 and the diode FWD are coupled in antiparallel to each other.

In the inverter circuit INV, between a HIGH-side terminal (e.g., positive potential terminal) HT to which a relatively high potential is supplied and each of the phases (U-, V-, and W-phases) of the 3-phase induction motor MT, the transistor Q1 and the diode FWD are coupled in antiparallel to each other. Also, between a LOW-side terminal (e.g., negative potential terminal) LT to which a potential relatively lower than in each of the phases of the 3-phase induction motor MT is supplied and each of the phases (U-, V-, and W-phases) of the 3-phase induction motor MT, the transistor Q1 and the diode FWD are coupled in antiparallel to each other. That is, for each of the phases, the two transistors Q1 and the two diodes FWD are provided and, consequently, the six transistors Q1 and the six diodes FWD are provided for the three phases. To the gate electrode of each of the transistors Q1, a gate control circuit GC is coupled to control the switching operation of the transistor Q1. In the inverter circuit INV thus configured, the gate control circuit GC controls the switching operation of the transistor Q1 to convert the DC power to the 3-phase AC power and supply the 3-phase AC power to the 3-phase induction motor MT.

In the inverter circuit INV in the present embodiment, the transistors Q1 as the IGBTs are used as the switching elements and the diodes FWD are provided so as to be coupled in antiparallel to the transistors Q1. In terms of merely implementing switching functions using the switching elements, the transistors Q1 as the switching elements are necessary. However, a configuration in which the diodes FWD are absent can also be considered. However, in the case where a load coupled to the inverter circuit INV includes inductance, it is necessary to provide the diodes FWD.

When the load is pure resistance not including inductance, the diodes FWD are unnecessary since there is no returning energy. However, in the case where a circuit including inductance, such as a motor, is coupled to the load, there is a mode in which a load current flows in a direction opposite to that of a current flow in the switch in an ON state. That is, in the case where the load includes inductance, energy may return to the inverter circuit INV due to the inductance of the load (current may flow backward).

At this time, since the transistor Q1 as the IGBT itself does not have the function of allowing a backward current to flow, it is necessary to couple the diode FWD in antiparallel to the transistor Q1. That is, in the case where the load includes inductance in the inverter circuit INV, such as in the case of motor control, the energy ($\frac{1}{2} LI^2$) stored in the inductance should necessarily be released when the transistor Q1 is turned OFF. However, the transistor Q1 cannot allow the backward current for releasing the energy stored in the inductance to flow by itself. Accordingly, to allow the electric energy stored in the inductance to flow backward, the diode FWD is coupled in antiparallel to the transistor Q1. That is, the diode FWD has the function of allowing the backward current to flow in order to release the electric energy stored in the inductance. For the reason described above, in the inverter circuit coupled to the load including inductance, it is necessary to provide the diode FWD in antiparallel with the transistor Q1 as the switching element. The diode FWD is referred to as a free wheel diode.

In the case of the inverter circuit INV in the present embodiment, as shown in, e.g., FIG. 1, between the HIGH-side terminal HT and the LOW-side terminal LT, a capacitive element CAP is coupled. The capacitive element CAP has the function of, e.g., smoothing switching noise in the inverter circuit INV and stabilizing a system voltage. In the example shown in FIG. 1, the capacitive element CAP is provided outside the inverter circuit INV, but the capacitive element CAP may also be provided inside the inverter circuit INV.

Also, the inverter circuit INV in the present embodiment is coupled to a resistive element R1 and to a detection circuit (current detection circuit) DTC. The resistive element R1 is a shunt resistor which measures a current flowing from the motor MT as a load to the LOW-side terminal LT via each of the lower arms. The detection circuit DTC is coupled to the both ends of the resistive element R1 as the shunt resistor. By detecting a voltage at the both ends of the resistive element R1 having a known resistance value, it is possible to calculate the current flowing in the resistive element R1. For example, the detection circuit DTC is an amplification circuit, and a voltage signal amplified by the amplification circuit is output from, e.g., a terminal (data output terminal) SDT. The details of the resistive element R1 and the detection circuit DTC will be described later.

<Structure of Power Semiconductor Chip>

Figure 2:
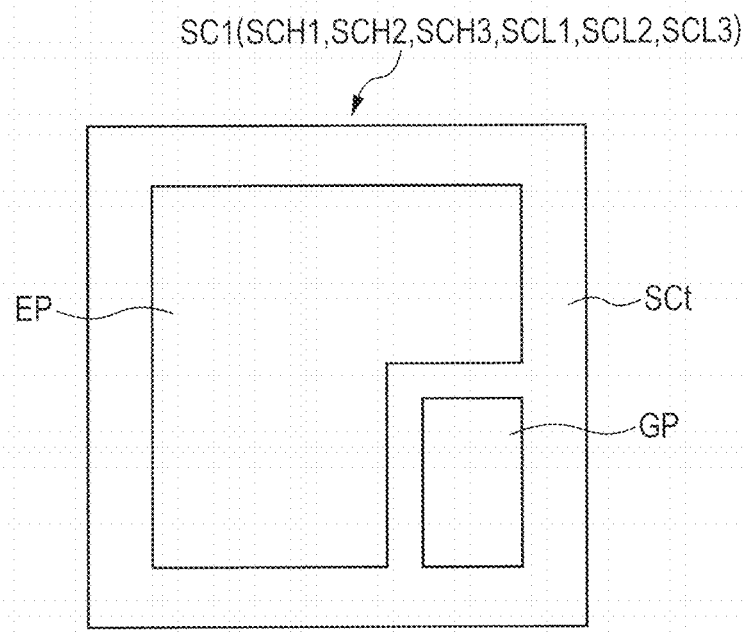
FIG. 2 is a plan view showing the top-side shape of a semiconductor chip in which the transistors shown in FIG. 1 are formed.
Figure 3:
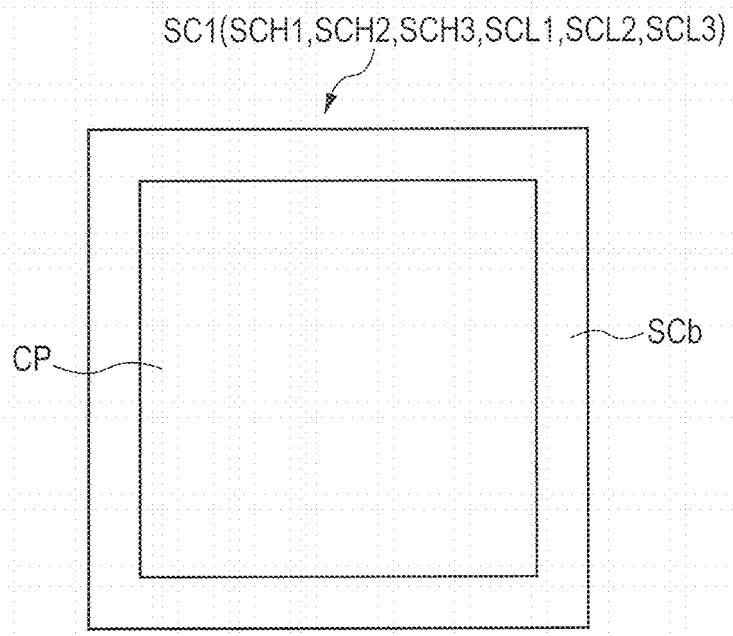
FIG. 3 is a plan view showing the back surface of the semiconductor chip shown in FIG. 2.
Figure 4:
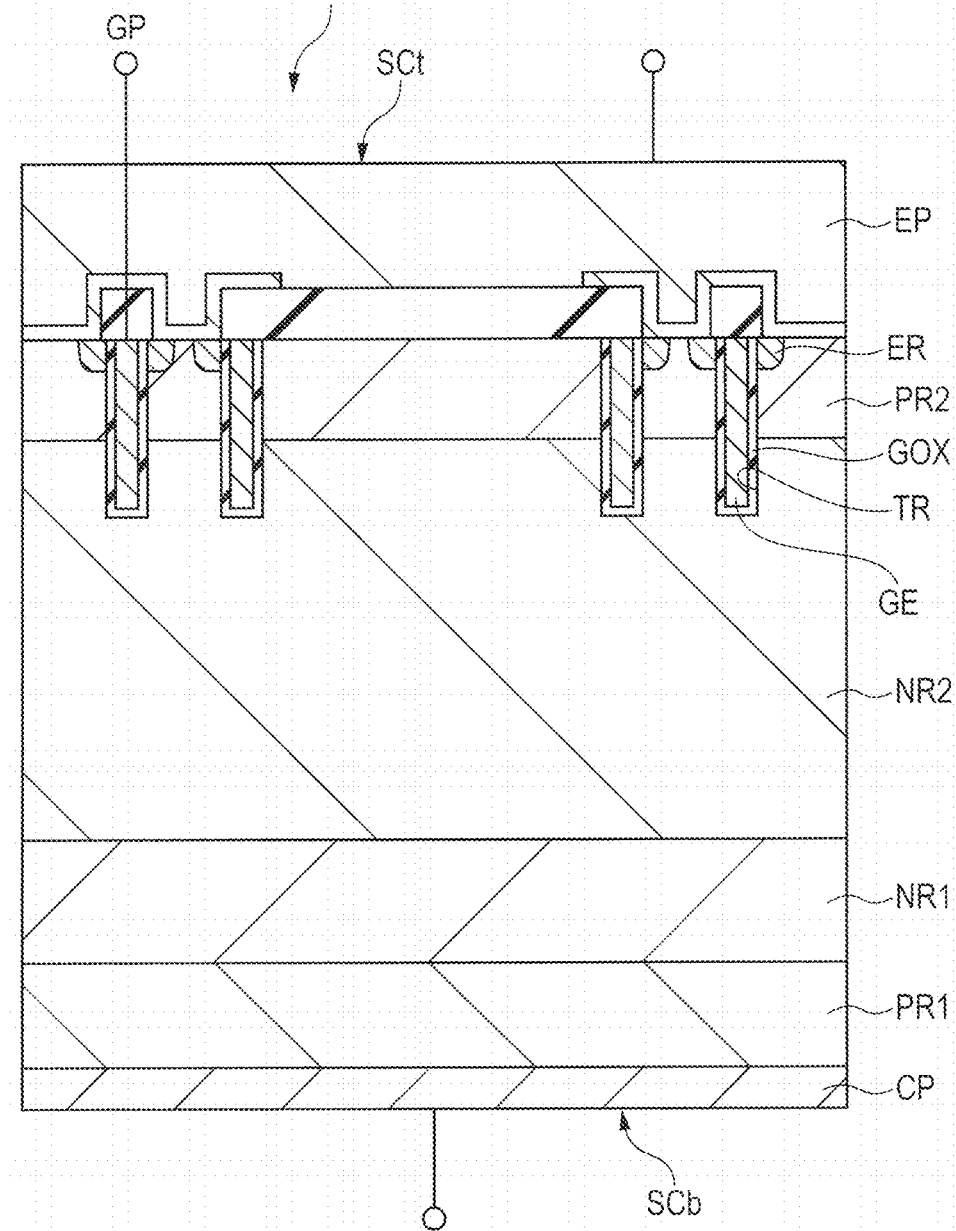
FIG. 4 is a cross-sectional view showing an example of a structure of each of the transistors included in the semiconductor chip shown in FIGS. 2 and 3.

Next, referring to the drawings, a description will be given of each of a structure of a power semiconductor chip including the transistors Q1 as the IGBTs included in the inverter circuit INV shown in FIG. 1 and a structure of the semiconductor chip including the diodes FWD. FIG. 2 is a plan view showing the top-side shape of a semiconductor chip in which the transistors shown in FIG. 1 are formed. FIG. 3 is a plan view showing the back surface of the semiconductor chip shown in FIG. 2. FIG. 4 is a cross-sectional view showing an example of a structure of each of the transistors included in the semiconductor chip shown in FIGS. 2 and 3.

In the case of the present embodiment, the transistors Q1 and the diodes FWD which are included in the inverter circuit INV are formed in the semiconductor chips independent of each other. The following will describe the semiconductor chip in which the transistors Q1 are formed, and then describe the semiconductor chip in which the diodes FWD are formed.

As shown in FIGS. 2 and 3, a semiconductor chip SC1 in the present embodiment has a top surface (surface, upper surface, or main surface) SCt (see FIG. 2) and a back surface (surface, lower surface, or main surface) SCb (see FIG. 3) opposite to the top surface SCt. Each of the top surface SCt and the back surface SCb of the semiconductor chip SC1 has a quadrilateral shape. For example, the area of the top surface SCt is equal to the area of the back surface SCb.

As also shown in FIG. 2, the semiconductor chip SC1 has a gate electrode (gate electrode pad or top surface electrode) GP formed over the top surface SCt and an emitter electrode (emitter electrode pad or top surface electrode) EP. In the example shown in FIG. 2, at the top surface SCt, the single gate electrode GP and the single emitter electrode EP are exposed. The area of the exposed portion of the emitter electrode EP is larger than the area of the exposed portion of the gate electrode GP. The emitter electrode EP is coupled to an output terminal of the inverter circuit INV (see FIG. 1) or to the LOW-side terminal LT (see FIG. 1). Accordingly, by increasing the area of the exposed portion of the emitter electrode EP, it is possible to reduce the impedance of a transmission path in which a high current flows.

As shown in FIG. 3, the semiconductor chip SC1 has a collector electrode (collector electrode pad or back surface electrode) CP formed over the back surface SCb. The collector electrode CP is formed over the entire back surface SCb of the semiconductor chip SC1. As can be seen from a comparison between FIGS. 2 and 3, the area of the exposed portion of the collector electrode CP is larger than the area of the exposed portion of the emitter electrode EP. The collector electrode CP is coupled to the output terminal of the inverter circuit INV (see FIG. 1) or to the HIGH-side terminal HT (see FIG. 1), though the details thereof will be described later. Accordingly, by increasing the area of the exposed portion of the collector electrode CP, it is possible to reduce the impedance of the transmission path in which the high current flows.

Note that, using FIGS. 2 and 3, the basic configuration of the semiconductor chip SC1 has been described, but various modifications can be used appropriately. For example, in addition to the electrodes shown in FIG. 2, an electrode for monitoring the operating state of the semiconductor chip SC1 such as a temperature detection electrode, a voltage sensing electrode, or a current sensing electrode, an electrode for inspecting the semiconductor chip SC1, and the like may also be provided. In the case of providing such electrodes, similarly to the gate electrode GP, such electrodes are exposed at the top surface SCt of the semiconductor chip SC1. Such electrodes correspond to signal transmission electrodes, and the area of the exposed portion of each of such electrodes is smaller than the area of the exposed portion of the emitter electrode EP.

Each of the transistors Q1 (see FIG. 4) included in the semiconductor chip SC1 has a structure as shown in, e.g., FIG. 4. Over the collector electrode CP formed over the back surface SCb of the semiconductor chip SC1, a $p^+$-type semiconductor region PR1 is formed. Over the $p^+$-type semiconductor region PR1, an $n^+$-type semiconductor region NR1 is formed. Over the $n^+$-type semiconductor region NR1, an $n^-$-type semiconductor region NR2 is formed. Over the $n^-$-type semiconductor region NR2, a p-type semiconductor region PR2 is formed. Trenches TR are formed to extend through the p-type semiconductor region PR2 and reach the $n^-$-type semiconductor region NR2. In alignment with the trenches TR, $n^+$-type semiconductor regions ER are formed to serve as emitter regions. In the trenches TR, gate insulating films GOX made of a silicon dioxide film are formed, and gate electrodes GE are formed via the gate insulating films GOX. The gate electrodes GE are formed of, e.g., a polysilicon film so as to be embedded in the trenches TR.

In the transistors Q1 thus configured, the gate electrodes GE are coupled to the gate electrode GP shown in FIG. 2. Likewise, the $n^+$-type semiconductor regions ER serving as the emitter regions are electrically coupled to the emitter electrode EP. The $p^+$-type semiconductor region PR1 serving as a collector region is electrically coupled to the collector electrode CP formed over the back surface SCb of the semiconductor chip SC1. Each of the transistors Q1 has the high-speed switching property and voltage driving property of a power MOSFET and the low ON-voltage property of a bipolar transistor.

Note that the $n^+$-type semiconductor region NR1 is referred to as a buffer layer. The $n^+$-type semiconductor region NR1 is provided in order to prevent a punch-through phenomenon in which a depletion layer which grows from the p-type semiconductor region PR2 into the $n^-$-type semiconductor region NR2 when the transistor Q1 is turned OFF comes into contact with the $P^+$-type semiconductor region PR1 formed in the layer under the $n^-$-type semiconductor region NR2. The $n^+$-type semiconductor region NR1 is also provided for the purpose of limiting a quantity of holes injected from the p$^+$-type semiconductor region PR1 into the n$^-$-type semiconductor region NR2 or the like.

The gate electrode GE of the transistor Q1 is coupled to the gate control circuit GC shown in FIG. 1. At this time, a signal from the gate control circuit GC is applied to the gate electrode GE (see FIG. 4) of the transistor Q1 via the gate electrode GP (see FIG. 4) to thus allow the switching operation of the transistor Q1 to be controlled by the gate control circuit CG.

Figure 5:
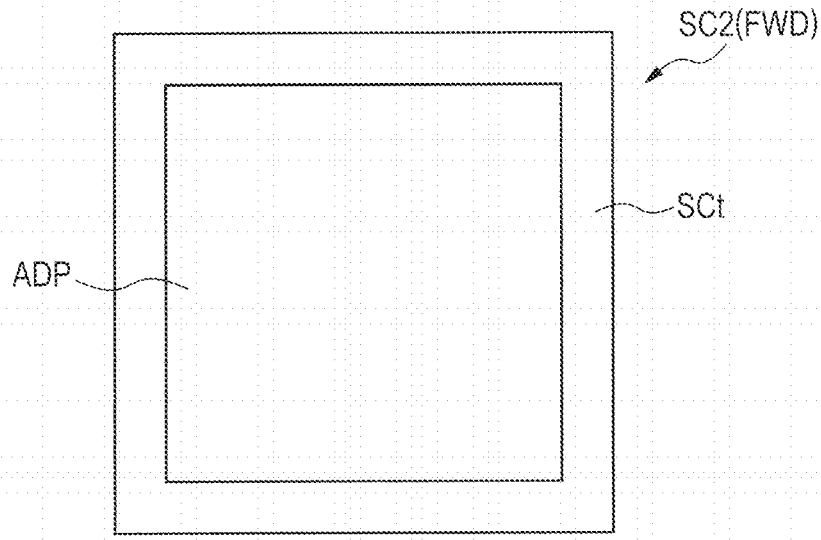
FIG. 5 is a plan view showing the top-side shape of a semiconductor chip in which the diodes shown in FIG. 1 are formed.
Figure 6:
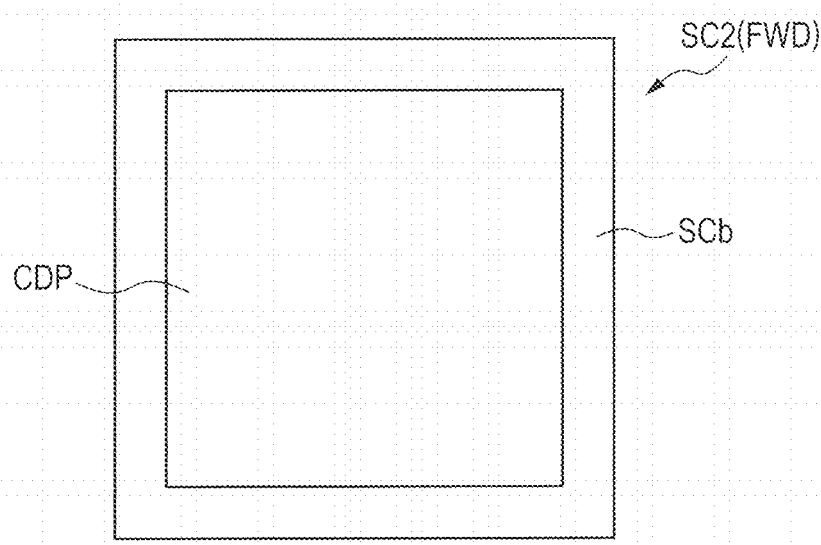
FIG. 6 is a plan view showing the back surface of the semiconductor chip shown in FIG. 5.
Figure 7:
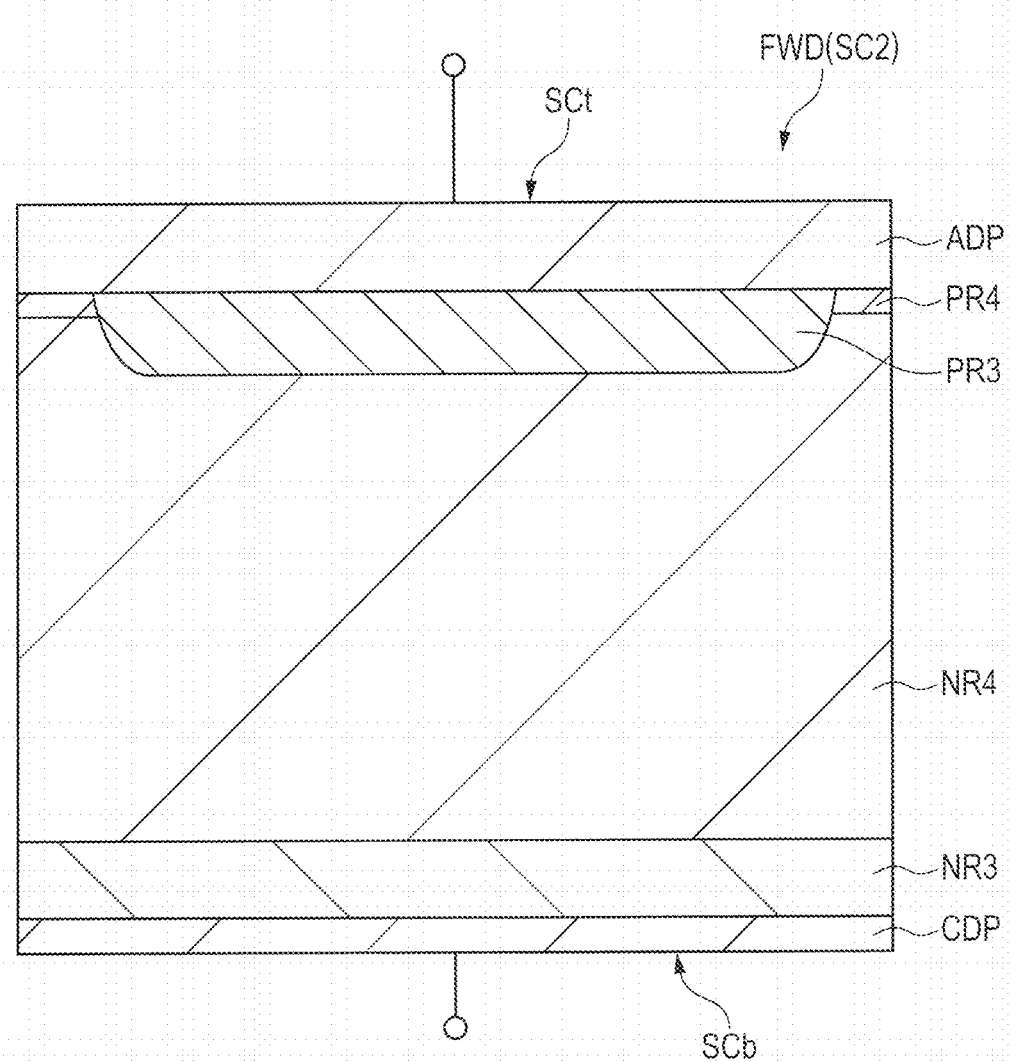
FIG. 7 is a cross-sectional view showing an example of a structure of each of the diodes included in the semiconductor chip shown in FIGS. 5 and 6.

Next, a description will be given of the semiconductor chip in which the diodes FWD shown in FIG. 1 are formed. FIG. 5 is a plan view showing the top-side shape of the semiconductor chip in which the diodes shown in FIG. 1 are formed. FIG. 6 is a plan view showing the back surface of the semiconductor chip shown in FIG. 5. FIG. 7 is a cross-sectional view showing an example of a structure of each of the diodes included in the semiconductor chip shown in FIGS. 5 and 6.

As shown in FIGS. 5 and 6, a semiconductor chip SC2 in the present embodiment has the top surface (surface, upper surface, or main surface) SCt (see FIG. 5) and the back surface (surface, lower surface, or main surface) SCb (see FIG. 6) opposite to the top surface SCt. Each of the top surface SCt and the back surface SCb of the semiconductor chip SC2 has a quadrilateral shape. For example, the area of the top surface SCt is equal to the area of the back surface SCb. As can be seen from a comparison between FIGS. 2 and 5, the area of the top surface SCt of the semiconductor chip SC1 (see FIG. 2) is larger than the area of the top surface SCt of the semiconductor chip SC2 (see FIG. 5).

As also shown in FIG. 5, the semiconductor chip SC2 has an anode electrode (anode electrode pad or top surface electrode) ADP formed over the top surface SCt. As also shown in FIG. 6, the semiconductor chip SC2 has a cathode electrode (cathode electrode pad or back surface electrode) CDP formed over the back surface SCb. The cathode electrode CDP is formed over the entire back surface SCb of the semiconductor chip SC2.

For example, each of the diodes FWD included in the semiconductor chip SC2 has a structure as shown in FIG. 7. As shown in FIG. 7, over the cathode electrode CDP formed over the back surface SCb of the semiconductor chip SC2, an n$^+$-type semiconductor region NR3 is formed. Over the n$^+$-type semiconductor region NR3, an n$^-$-type semiconductor region NR4 is formed. Over the n$^-$-type semiconductor region NR4, p-type semiconductor regions PR3 spaced apart from each other are formed. Between the p-type semiconductor regions PR3, a p$^-$-type semiconductor region PR4 is formed. Over the p-type semiconductor regions PR3 and the p$^-$-type semiconductor region PR4, the anode electrode ADP is formed. The anode electrode ADP is made of, e.g., an Al—Si alloy.

In the diode FWD thus configured, when a positive voltage is applied to the anode electrode ADP and a negative voltage is applied to the cathode electrode CDP, a pn junction between the n$^-$-type semiconductor region NR4 and each of the p-type semiconductor regions PR3 is forwardly biased to allow a current to flow. On the other hand, when a negative voltage is applied to the anode electrode ADP and a positive voltage is applied to the cathode electrode CDP, the pn junction between the n$^-$-type semiconductor region NR4 and each of the p-type semiconductor regions PR3 is reversely biased to prevent a current from flowing. In this manner, the diode FWD having a rectifying function can be operated.

<Configuration of Drive Circuit>

Figure 8:
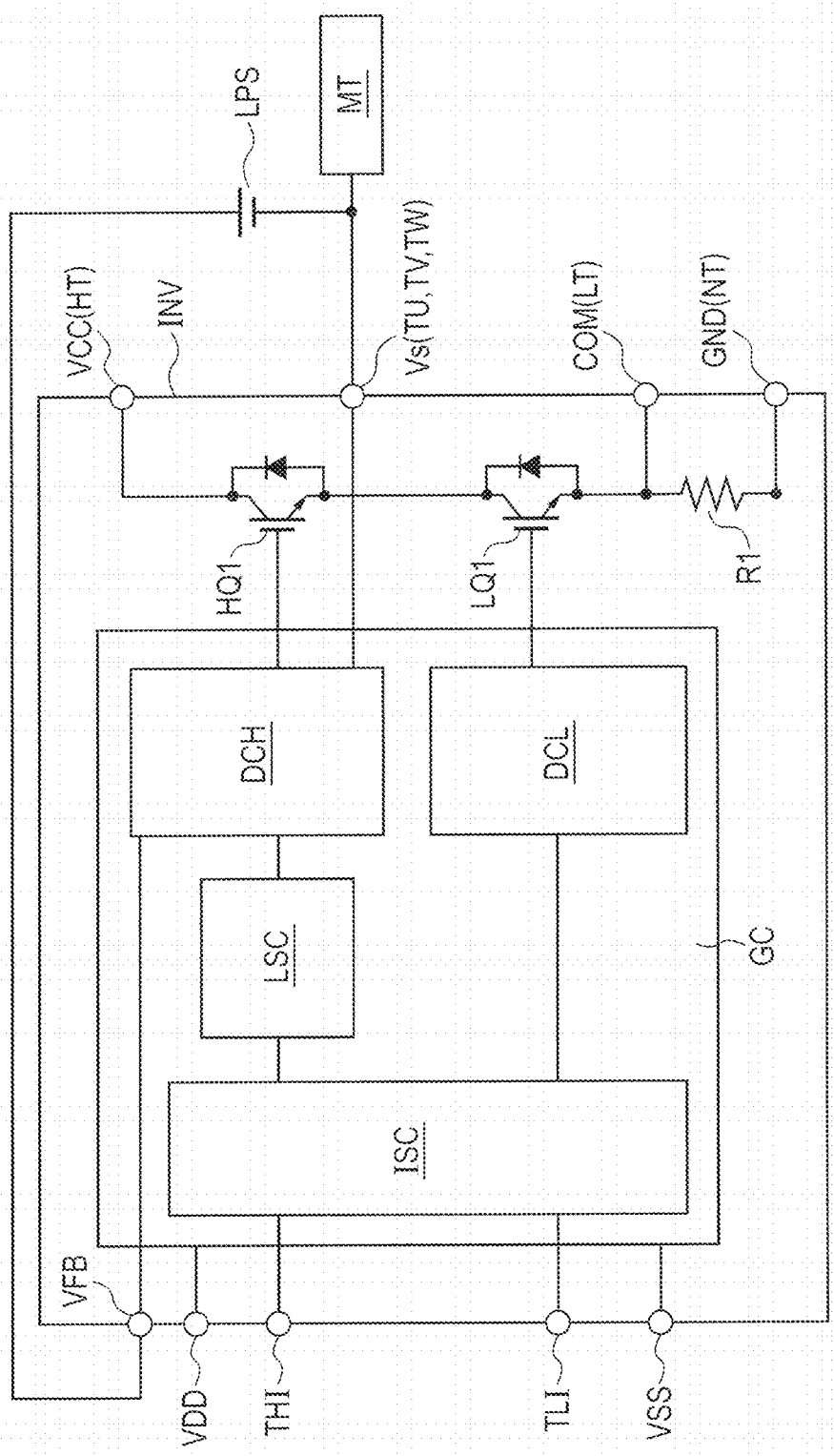
FIG. 8 is a view showing a circuit block configuration of a gate control circuit.

Next, a description will be given of a configuration of the gate control circuit GC shown in FIG. 1. FIG. 8 is a view showing a circuit block configuration of the gate control circuit GC. It is assumed that, in the description of the configuration of the gate control circuit GC given with reference to FIG. 8, by way of example, the gate control circuit GC controls one of the three phases of the inverter circuit INV which drives the 3-phase induction motor MT. In FIG. 8, between a terminal VCC electrically coupled to a high-voltage power supply and a terminal COM electrically coupled to, e.g., a low-voltage power supply, e.g., a HIGH-side transistor HQ1 and a LOW-side transistor LQ1 which form the one of the three phases of the inverter circuit INV are coupled in series to each other. A middle node between the HIGH-side transistor HQ1 and the LOW-side transistor LQ1 is electrically coupled to the 3-phase induction motor MT via a terminal Vs.

The gate control circuit GC mentioned herein is configured so as to control the ON/OFF operation of the HIGH-side transistor (HIGH-side IGBT) HQ1 and the ON/OFF operation of the LOW-side transistor (LOW-side IGBT) LQ1. For example, the gate control circuit GC controls the gate voltage applied to the gate electrode of the HIGH-side transistor HQ1 to thus implement the ON/OFF operation of the HIGH-side transistor HQ1 and controls the gate voltage applied to the gate electrode of the LOW-side transistor LQ1 to thus implement the ON/OFF operation of the LOW-side transistor LQ1.

The gate control circuit GC shown in FIG. 8 is coupled to, e.g., a terminal VDD electrically coupled to a low-voltage power supply (e.g., 15 volts) and to a terminal VSS electrically coupled to a reference potential (e.g., fixed potential such as a ground potential). Note that, in the example shown in FIG. 9 described later, the terminal VDD is coupled to a logic circuit LOG, and a low voltage is supplied from the low-voltage power supply to the gate control circuit GC via the logic circuit LOG. The gate control circuit GC has an input signal processing circuit ISC which processes input signals input from a terminal TH1 and a terminal TL1 of the inverter circuit INV, a level shift circuit LSC, a LOW-side drive circuit DCL, and a HIGH-side drive circuit DCH.

The LOW-side drive circuit DCL controls the gate voltage applied to the gate electrode of the LOW-side transistor LQ1 on the basis of a processed signal output from the input signal processing circuit ISC. For example, the LOW-side drive circuit DCL receives the reference potential from the terminal VSS and supplies the gate voltage generated on the basis of the reference potential to the gate electrode of the LOW-side transistor LQ1. When the gate voltage supplied to the gate electrode is not lower than a threshold voltage relative to the reference potential, the LOW-side transistor LQ1 is turned ON. On the other hand, when the gate voltage supplied to the gate electrode is lower than the threshold voltage relative to the reference potential, the LOW-side transistor LQ1 is turned OFF. Thus, the ON/OFF operation of the LOW-side transistor LQ1 is controlled by the LOW-side drive circuit DCL.

On the other hand, the HIGH-side drive circuit DCH inputs the processed signal from the input signal processing circuit LSC to the level shift circuit LSC, and then controls the gate voltage applied to the gate electrode of the HIGH-side transistor HQ1 on the basis of the output signal from the level shift circuit LSC. For example, the HIGH-side drive circuit DCH receives the reference potential serving as a reference from the terminal Vs coupled to the motor MT as the load. The HIGH-side transistor HQ1 uses, e.g., the emitter potential of the HIGH-side transistor HQ1 as the reference potential. However, the emitter potential of the HIGH-side transistor HQ1 varies between the potential supplied to the terminal COM and the potential supplied to the terminal VCC. When the HIGH-side transistor HQ1 is ON, the emitter potential of the HIGH-side transistor HQ1 is equal to a power supply potential supplied to the terminal VCC. This means that, in order to turn ON the HIGH-side transistor HQ1, the gate voltage needs to be generated on the basis of the power supply potential. Accordingly, the HIGH-side drive circuit DCH receives the emitter potential of the HIGH-side transistor HQ1 from the terminal Vs and generates the gate voltage applied to the gate electrode of the HIGH-side transistor HQ1 on the basis of the potential received from the terminal Vs. Since the potential received from the terminal Vs varies to the power supply potential, a potential higher than the power supply potential is required as the gate voltage of the HIGH-side transistor HQ1 which is generated on the basis of the potential received from the terminal Vs. The HIGH-side drive circuit DCH couples, e.g., a terminal VFB to a LOW-voltage power supply LPS (e.g., 15 volts) located outside the inverter circuit INV (i.e., a semiconductor device PKG1 shown in FIG. 9 described later) and generates the gate voltage higher than the power supply potential using the potential received from the terminal VFB. The gate voltage is supplied from the HIGH-side drive circuit DCH to the gate electrode of the HIGH-side transistor HQ1. Thus, when the gate voltage supplied to the gate electrode is not lower than the threshold voltage relative to the reference potential, the HIGH-side transistor HQ1 is turned ON. On the other hand, when the gate voltage supplied to the gate electrode is lower than the threshold voltage relative to the reference potential, the HIGH-side transistor HQ1 is turned OFF. Thus, the ON/OFF operation of the HIGH-side transistor HQ1 is controlled by the HIGH-side drive circuit DCH.

<About Measurement of Current>

As described above, the power conversion circuit supplies power through the switching operation. Accordingly, when the power conversion circuit is used, it is preferable to monitor whether or not the switching operation is performed correctly. As a method for monitoring the switching operation of the power conversion circuit, there is a method which monitors a current flowing in the circuit. For example, when an overcurrent flowing in the circuit is detected as a result of monitoring of a current flowing in the circuit, it is possible to halt a power supply and reduce the damage to the load. For example, when the current flowing in the circuit continues to be measured, it is possible to perform feedback control on the operation of the power conversion circuit using the measurement result.

However, when a current flowing in the circuit is measured and the power conversion circuit is controlled on the basis of the measurement result as described above, it is required to perform the measurement with high accuracy. For example, when the operation of the power conversion circuit is frequently halted as a result of erroneous detection of an overcurrent, the operational efficiency of the system in which the power conversion circuit is incorporated deteriorates. When the feedback control is performed, it is necessary to perform the measurement with particularly high accuracy.

Accordingly, the present inventors have conducted study about a technique which measures a current in a power conversion circuit. As a method for measuring a current flowing in a power conversion circuit, a method using a shunt resistor can be listed first. The current measurement method using the shunt resistor allows a current flowing in the resistive element R1 (see FIG. 1) to be calculated by detecting a voltage at the both ends of the resistive element R1 having a known resistance value. In this case, compared to a method which directly measures a current value, the influence of noise or the like is relatively small, and therefore measurement accuracy can be improved. In the present embodiment, as shown in FIG. 1, a LOW-side detection method is used appropriately in which the resistive element R1 is coupled to the lower-potential side of the motor MT as the load. In a modification of FIG. 1, a HIGH-side detection method may also be used appropriately in which the resistive element R1 is coupled to the higher-potential side of the motor MT as the load. In the case of using the LOW-side detection method, it is sufficient to detect the potential difference produced with the ground potential. This allows the configuration of the detection circuit to be simplified. On the other hand, in the case of using the HIGH-side detection method, even when the motor MT as the load is grounded, the detection can be performed.

By thus measuring a current using the shunt resistor, it is possible to improve the measurement accuracy. However, when there is a long distance between the shunt resistor and the power conversion circuit, in a path from the power conversion circuit to the shunt resistor, the measurement is affected by noise or the like. As a result, a correct value may not be able to be measured. Accordingly, in terms of improving the accuracy of measuring a current, the length of the path between the shunt resistor and the current conversion circuit is preferably minimized. For example, as shown in FIG. 1, when the inverter circuit INV and the resistive element R1 as the shunt resistor are embedded in the semiconductor device PKG1, the length of the path between the inverter circuit INV and the resistive element R1 can be reduced.

However, as a result of conducting the study, the present inventors have found that, by inventively modifying the layout of the plurality of electronic components included in the inverter circuit INV and the resistive element R1, the accuracy of measuring a current can further be improved.

<Configuration of Semiconductor Device>

Figure 9:
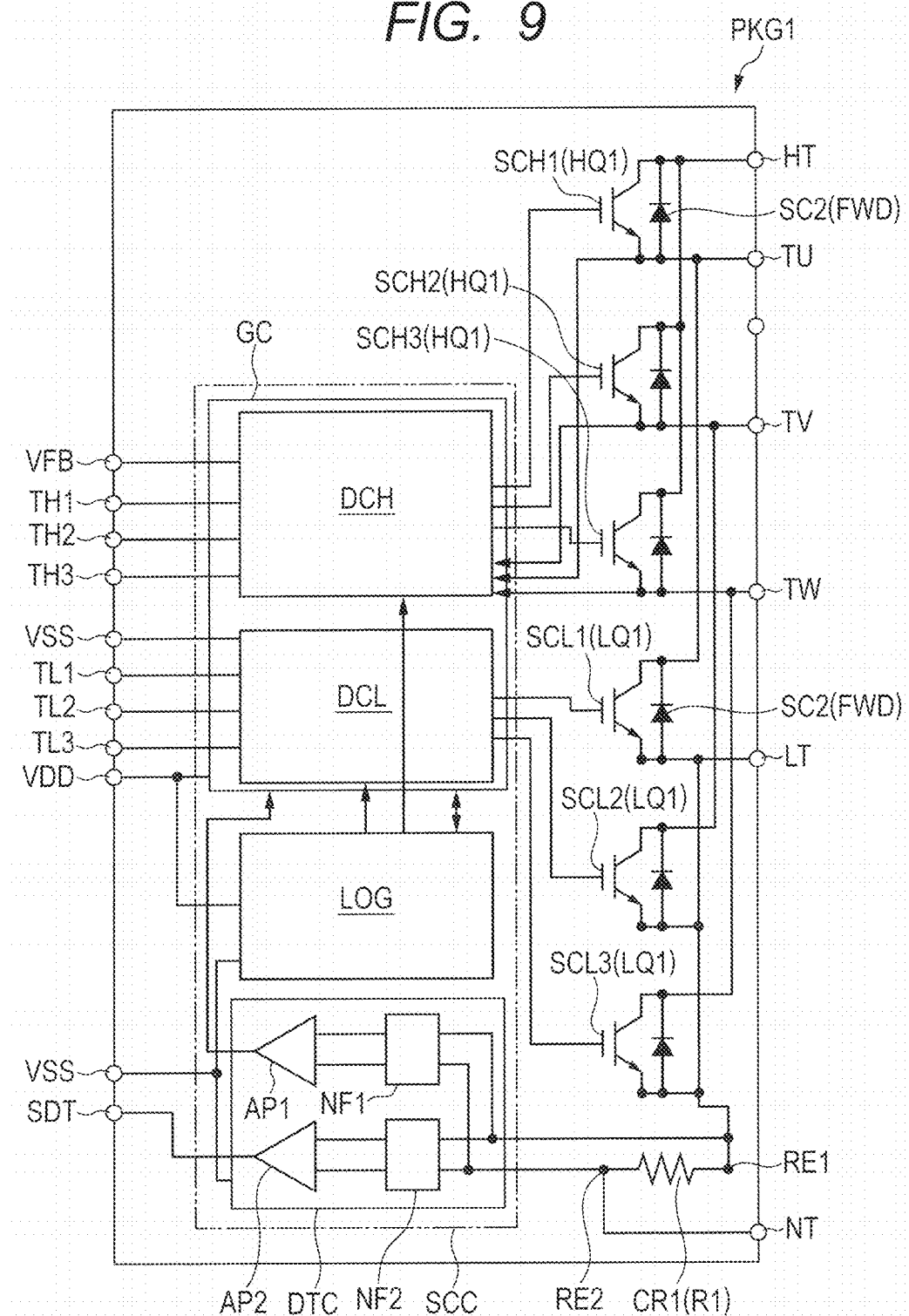
FIG. 9 is an illustrative view showing the details of a circuit configuration of the semiconductor device shown in FIG. 1.

Using the drawings, the following will describe an example of the configuration of the semiconductor device PKG1 included in the inverter circuit INV shown in FIG. 1 in detail. FIG. 9 is an illustrative view showing the details of the circuit configuration of the semiconductor device shown in FIG. 1. In FIG. 9, the illustration of the input signal processing circuit ISC and the level shift circuit LSC each described using FIG. 8 is omitted. In the example shown in FIG. 9, the input signal processing circuit ISC (see FIG. 8) is provided inside each of the LOW-side drive circuit DCL and the HIGH-side drive circuit DCH, while the level shift circuit LSC (see FIG. 8) is provided inside the HIGH-side drive circuit DCH.

As shown in FIG. 9, the semiconductor device PKG1 according to the present embodiment includes six power semiconductor chips (semiconductor chips SCH1, SCH2, SCH3, SCL1, SCL2, and SCL3) included in the switching elements of the inverter circuit and a control chip (semiconductor chip SCC) which controls the operation of each of the power semiconductor chips. Note that, as described above, the power transistors included in the power semiconductor chips in the present embodiment are the IGBTs. Accordingly, each of the plurality of power semiconductor chips is coupled to the semiconductor chip SC2 in which the diodes FWD are formed.

The collector electrode of each of the semiconductor chips SCH1, SCH2, and SCH3 as the HIGH-side power semiconductor chips is coupled to the terminal (lead or outer lead) HT coupled to a transmission path for a relatively high power supply potential via the cathode electrode of the semiconductor chip SC2 in which the diodes FWD are formed. From the terminal HT, a high power supply potential of, e.g., about 600 V is supplied. The emitter electrode of each of the semiconductor chips SCH1, SCH2, and SCH3 as the HIGH-side power semiconductor chips is coupled to any of terminals (leads or outer leads) TU, TV, and TW as output terminals coupled to the motor MT (see FIG. 1) as the load via the anode electrode of the semiconductor chip SC2 in which the diodes FWD are formed. In the example shown in FIG. 9, the emitter electrode of the semiconductor chip SCH1 is coupled to the terminal TU, the emitter electrode of the semiconductor chip SCH2 is coupled to the terminal TV, and the emitter electrode of the semiconductor chip SCH3 is coupled to the terminal TW.

The collector electrode of each of the semiconductor chips SCL1, SCL2, and SCL3 as the LOW-side power semiconductor chips is coupled to any of the terminals TU, TV, and TW via the cathode electrode of the semiconductor chip SC2 in which the diodes FWD are formed. In the example shown in FIG. 9, the collector electrode of the semiconductor chip SCL1 is coupled to the terminal TU, the collector electrode of the semiconductor chip SCL2 is coupled to the terminal TV, and the collector electrode of the semiconductor chip SCL3 is coupled to the terminal TW. The emitter electrode of each of the semiconductor chips SCL1, SCL2, and SCL3 as the LOW-side power semiconductor chips is coupled to the terminal (lead or outer lead) LT coupled to a transmission path for a relatively low power supply potential via the anode electrode of the semiconductor chip SC2.

The gate electrode of each of the six power semiconductor chips is electrically coupled to the semiconductor chip SCC as the control chip. Specifically, the semiconductor chip SCC has the HIGH-side drive circuit DCH which drives the HIGH-side switching elements and the LOW-side drive circuit DCL which drives the LOW-side switching elements. The gate electrode of each of the semiconductor chips SCH1, SCH2, and SCH3 as the HIGH-side power semiconductor chips is electrically coupled to the HIGH-side drive circuit DCH of the semiconductor chip SCC. On the other hand, the gate electrode of each of the semiconductor chips SCL1, SCL2, and SCL3 as the LOW-side power semiconductor chips is electrically coupled to the LOW-side drive circuit DCL of the semiconductor chip SCC.

The HIGH-side drive circuit DCH of the semiconductor chip SCC is coupled to terminals (leads or outer leads) TH1, TH2, and TH3 as input terminals to which a HIGH-side control input signal is supplied. The HIGH-side drive circuit DCH is also coupled to the terminal VFB to which the potential used for the generation of a HIGH-side gate voltage is supplied. Note that, in FIG. 9, the one terminal VFB is shown as a representative, but the respective terminals VFB are provided for the U-, V-, and W-phases. Accordingly, to the HIGH-side drive circuit DCH, the three terminals VFB are coupled.

The LOW-side drive circuit DCL of the semiconductor chip SCC is coupled to the terminals (leads or outer leads) TL1, TL2, and TL3 as input terminals to which a LOW-side control input signal is supplied. The LOW-side drive circuit DCL is coupled to the terminal VSS to which a potential used for the generation of a LOW-side gate voltage is supplied.

The semiconductor chip SCC has the logic circuit LOG which performs arithmetic processing for the control of the operation of each of the HIGH-side drive circuit DCH and the LOW-side drive circuit DCL. When the semiconductor chip SCC thus includes the logic circuit LOG, the processing of data and the generation of control signals can be performed inside the semiconductor chip SCC, resulting in a high signal transmission speed. However, in a modification of the present embodiment, it may also be possible that the semiconductor chip SCC does not include the logic circuit LOG and performs signal transmission with an arithmetic processing circuit provided outside the semiconductor device PKG1.

As described above, the semiconductor device PKG1 in the present embodiment has the embedded resistive element R1 operating as the shunt resistor. The resistive element R1 is embedded in a resistive component (electronic component, chip component, or chip resistor) CR1 shown in FIG. 12 described later. The resistive element R1 has one end portion coupled to an electrode RE1 and the other end portion coupled to an electrode RE2. As shown in FIG. 9, the electrode RE1 is electrically coupled to the emitter electrode EP (see FIG. 2) of each of the semiconductor chips SCL1, SCL2, and SCL3 as the LOW-side power semiconductor chips. The electrode RE1 is also coupled to the terminal LT as the LOW-side terminal, while the electrode RE2 is coupled to a terminal NT coupled to the ground potential (grounding potential). When no current flows in the resistive element R1, the terminals LT and NT are at the same potential (e.g., ground potential). However, when a current flows in the resistive element R1, a voltage drop occurs to change the potential at the terminal LT. The detection circuit DTC measures the potential change at the terminal LT as a voltage value and detects a current flowing in the resistive element R1. Accordingly, each of the electrodes RE1 and RE2 at the both ends of the resistive element R1 is coupled to the detection circuit DTC of the semiconductor chip SCC.

In the example shown in FIG. 9, the detection circuit DTC includes a noise filter circuit NF1 and an amplification circuit (operational amplifier) AP1 coupled to the noise filter circuit NF1. The noise filter circuit NF1 is coupled between the amplification circuit AP1 and the resistive element R1. Potentials at the electrodes RE1 and RE2 of the resistive element R1 are subjected to noise reduction by the noise filter circuit NF1 and then input to the amplification circuit AP1. When the potential difference detected by the amplification circuit AP1 is not lower than a preset threshold voltage, a shut-down signal is output to the gate control circuit GC to halt a current supply to the load. That is, the detection circuit DTC in the present embodiment measures the potential difference between the two electrodes of the resistive element R1 as the shunt resistor to detect an overcurrent when the overcurrent flows in the inverter circuit. When detecting an overcurrent, the detection circuit DTC outputs the shut-down signal to the gate control circuit GC in the semiconductor chip SCC. In the semiconductor device PKG1, the transmission distance between the detection circuit DTC and the gate control circuit GC is short. This can reduce a transmission time from the detection of the overcurrent by the detection circuit DTC to the inputting of the shut-down signal to the gate control circuit GC. In addition, since the transmission distance for the shut-down signal is short, it is possible to reduce a noise component that affects the shut-down signal.

Also, in the example shown in FIG. 9, the detection circuit DTC includes a noise filter circuit NF2 and an amplification circuit (operational amplifier) AP2 coupled to the noise filter circuit NF2. The noise filter circuit NF2 is coupled between the amplification circuit AP2 and the resistive element R1. The respective potentials at the electrodes RE1 and RE2 of the resistive element R1 are subjected to noise reduction by the noise filter circuit NF2 and then input to the amplification circuit AP2. The potential difference detected by the amplification circuit AP2 is output as a signal to the outside of the semiconductor device PKG1 via the terminal (lead or outer lead) SDT. By thus measuring the potential difference between the two electrodes of the resistive element R1 as the shunt resistor, the detection circuit DTC in the present embodiment can monitor the value of the current flowing in the inverter circuit. It is also possible to adjust the signal input to the gate control circuit GC on the basis of the signal output from the terminal SDT. In other words, the signal output from the terminal SDT can also be used as a feedback control signal.

Note that, in the example shown in FIG. 9, the detection circuit DTC includes two detection circuits, i.e., a set including the noise filter circuit NF1 and a amplification circuit AP1 and the set including the noise filter circuit NF2 and the amplification circuit AP2. However, the number of the amplification circuits included in the detection circuit DTC is not limited to that in the example shown in FIG. 9. For example, the detection circuit DTC may include either one of the amplification circuits AP1 and AP2. Alternatively, for example, the detection circuit DTC may also include another amplification circuit in addition to the amplification circuits AP1 and AP2. There is also a modification in which the noise filter circuits NF1 and NF2 are not interposed between the amplification circuits AP1 and AP2 and the resistive element R1. However, by reducing the noise components of the signals input to the amplification circuits AP1 and AP2, the detection accuracy of the detection circuit DTC can be improved. Accordingly, as in the present embodiment, the noise filters NF1 and NF2 are preferably interposed between the amplification circuits AP1 and AP2 and the resistive element R1.

<Outer Appearance Structure>

Figure 10:
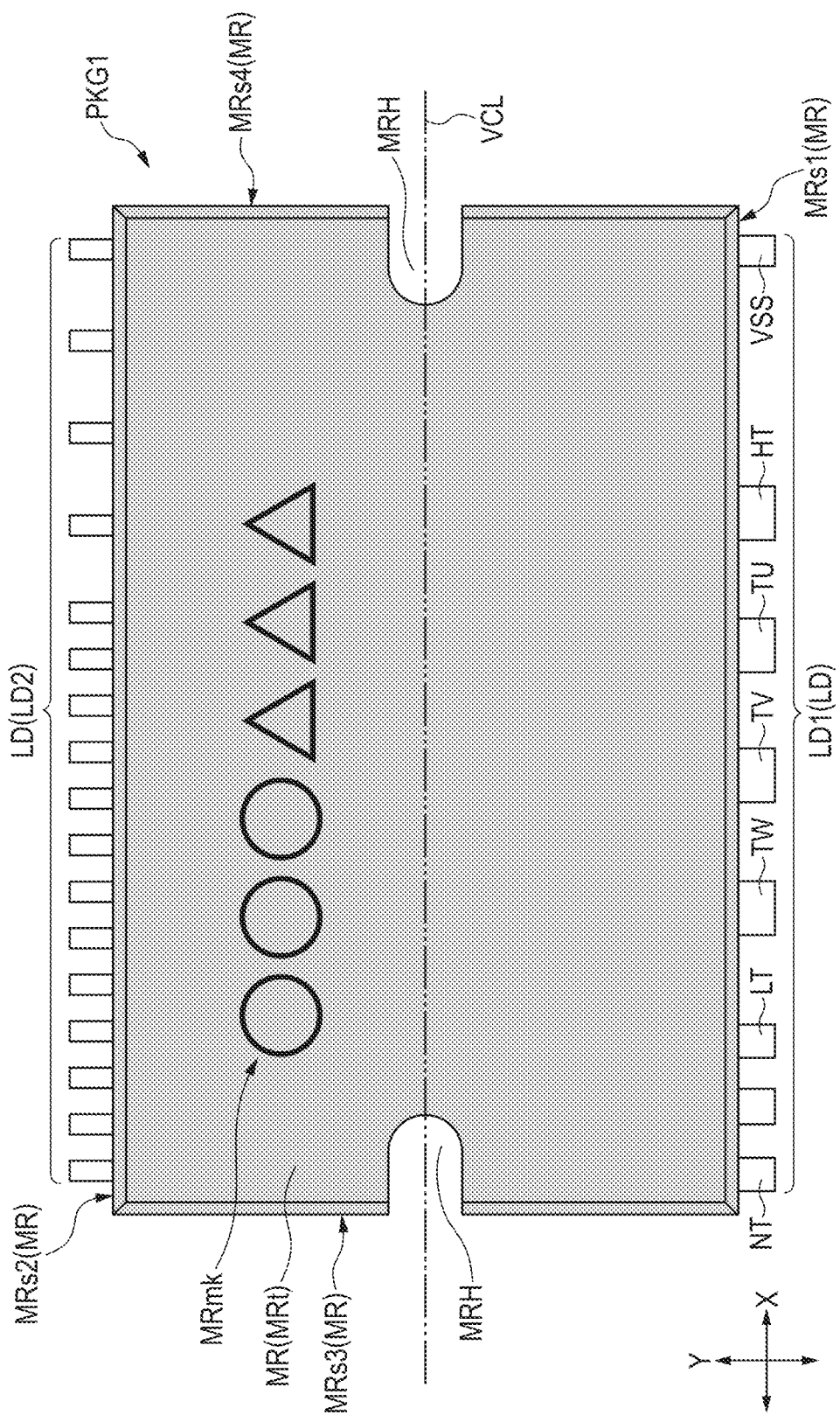
FIG. 10 is a plan view showing the outer appearance of a semiconductor device including the circuit shown in FIG. 9.
Figure 11:
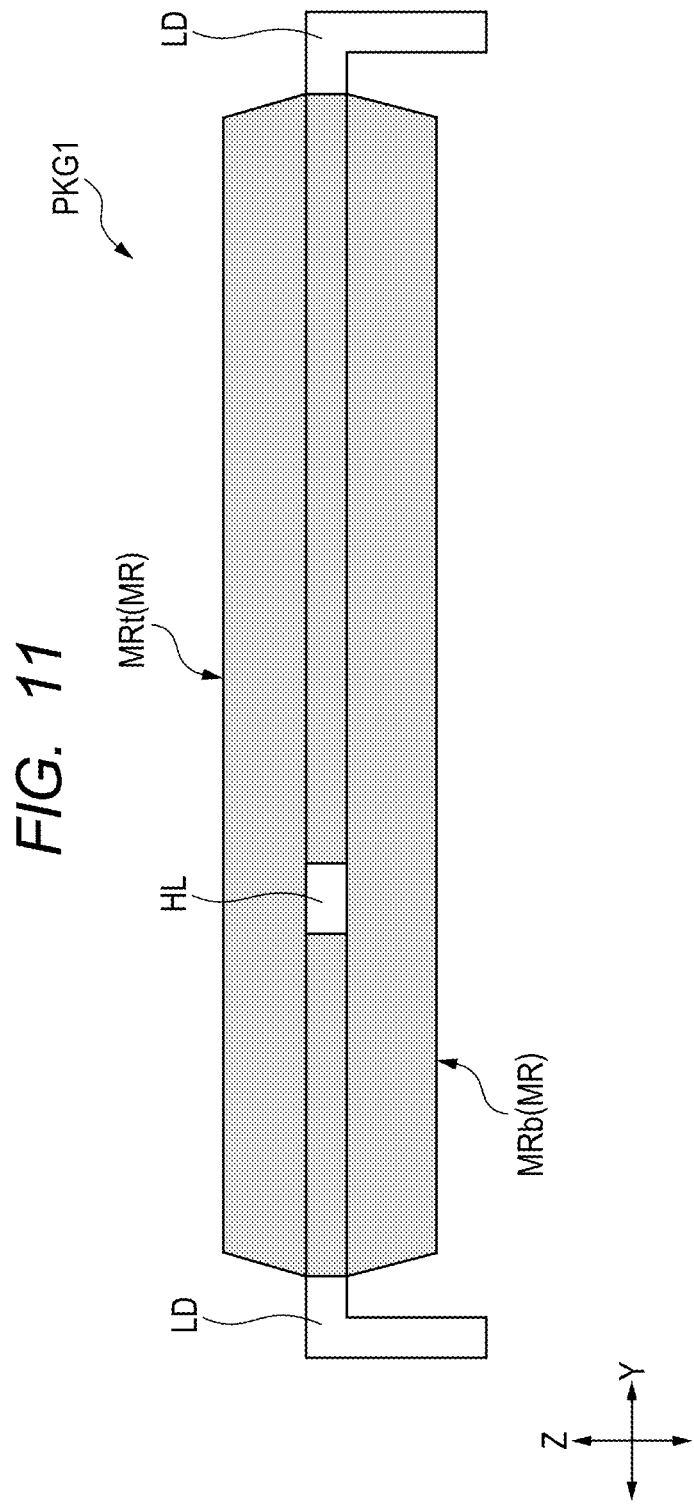
FIG. 11 is a side view along a Y-direction in FIG. 10.

The plurality of semiconductor chips and the resistive component CR1 (see FIG. 12) including the resistive element R1, which are shown in FIG. 9, are sealed in a sealing body MR shown in FIG. 10. FIG. 10 is a plan view showing the outer appearance of a semiconductor device including the circuit shown in FIG. 9. FIG. 11 is a side view along a Y-direction in FIG. 10.

As shown in FIG. 10, the sealing body MR of the semiconductor device PKG1 has a side (long side) MRs1 extending along an X-direction in plan view, a side (long side) MRs2 located opposite to the side MRs1, a side (short side) MRs3 extending along the Y-direction crossing the X-direction (orthogonal to the X-direction in FIG. 10), and a side (short side) MRs4 located opposite to the side MRs3. The sides MRs1 and MRs2 are relatively long compared to the sides MRs3 and MRs4. Note that, in the example shown in FIG. 10, the sealing body MR of the semiconductor device PKG1 has a quadrilateral shape (oblong shape in FIG. 10) in plan view. However, the two-dimensional shape of the semiconductor device PKG1 has various modifications in addition to the quadrilateral shape. For example, it may also be possible to cut the portions of the four corners of the quadrilateral shape which correspond to the points of intersection where the long sides and the short sides cross each other in directions diagonal to the X- and Y-directions. In this case, it is possible to inhibit the corners of the sealing body MR from being lost.

Figure 12:
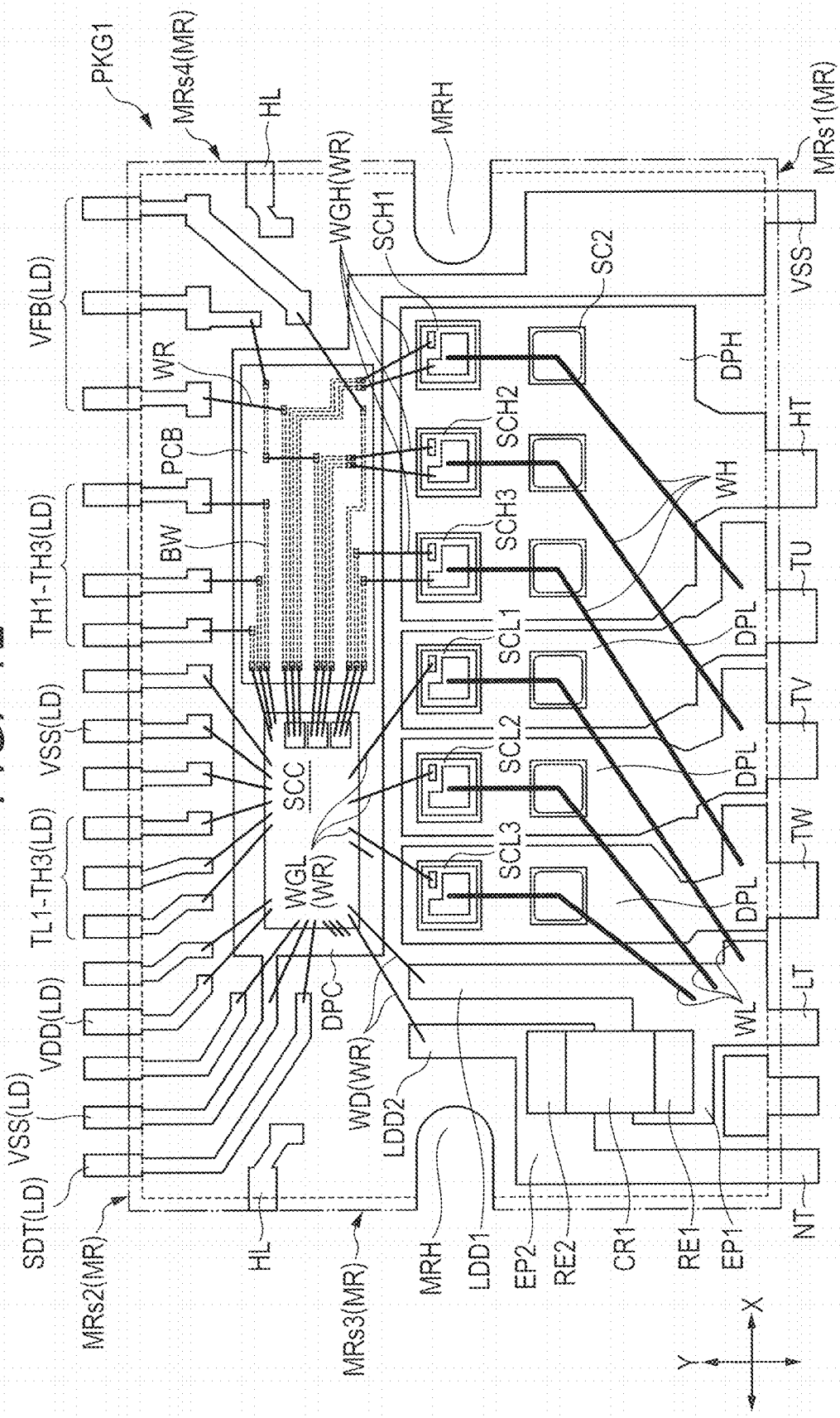
FIG. 12 is a plan view showing an inner structure of the semiconductor device through the sealing body shown in FIG. 10.

From the side surfaces of the sealing body MR, a plurality of leads LD are exposed. Specifically, from each of the sides MRs1 and MRs2 as the long sides located opposite to each other among the plurality of sides of the sealing body MR, the plurality of leads LD are exposed. On the other hand, the leads LD are not exposed from the sides MRs3 and MRs2 as the short sides located opposite to each other among the plurality of sides of the sealing body MR. However, as shown in FIG. 11, portions (cut surfaces) of suspension leads HL shown in FIG. 12 are exposed from the sides MRs3 and MRs4 shown in FIG. 10. A package structure in which the plurality of leads LD thus project selectively from the long sides of the sealing body MR having an oblong (rectangular) two-dimensional shape which are located opposite to each other is referred to as a DIP (Dual Inline package) or a SOP (Small Outline Package). Note that, in the example shown in FIG. 11, each of the plurality of leads LD has a shape extending along a Z-direction as the thickness direction of the sealing body MR (direction from one of an upper surface MRt and a lower surface MRb toward the other). The semiconductor device PKG1 having the leads each having such a shape is referred to as the DIP. However, in a modification of the present embodiment, the present invention may also be applied to a package structure such as SOP or SON (Small Outline Non-Leaded Package). In this case, the semiconductor device can be mounted along the top surface of a mounting substrate not shown.

Among the plurality of leads LD, each of a plurality of leads LD1 exposed from the side MRs1 of the sealing body MR is coupled to the emitter electrode or collector electrode of any of the plurality of power semiconductor chips (semiconductor chips SCH1, SCH2, SCH3, SCL1, SCL2, and SLC3) shown in FIG. 9. Each of the plurality of leads LD1 forms a portion of a high-voltage circuit operating at a relatively high voltage, such as the terminal HT, TU, TV, or TW. On the other hand, among the plurality of leads LD, each of a plurality of leads LD2 exposed from the side MRs2 of the sealing body MR is coupled mainly to the semiconductor chip SCC shown in FIG. 9. Each of the plurality of leads LD2 forms a portion of a low-voltage circuit operating at a relatively low voltage, such as each of the terminals TH1 to TH3, TL1 to TL3, VSS, VDD, and SDT shown in FIG. 9. By thus exposing the plurality of leads LD1 included in the high-voltage circuit and the plurality of leads LD2 included in the low-voltage circuit from the opposite sides, it is possible to increase the creeping distance between the high-voltage circuit and the low-voltage circuit outside the sealing body MR. As a result, it is possible to inhibit creeping discharge between the high-voltage circuit and the low-voltage circuit.

The upper surface MRt of the sealing body MR has an inscribed mark MRmk. The mark MRmk is an identification symbol for, e.g., the model of a product or the like. In the sealing body MR, a plurality of (two in FIG. 10) openings MRH are formed. Each of the openings MRH is an insertion portion through which a fixation jig such as a screw is inserted when the semiconductor device PKG1 is fixed onto a mounting substrate not shown. The openings MRH are formed so as to extend from one of the upper and lower surfaces MRt and MRb (see FIG. 11) of the sealing body MR to the other through the sealing body MR. Each of the plurality of openings MRH is located at a position overlapping a center line (virtual line) VCL connecting the respective middle points of the sides MRs3 and MRs4 as the short sides among the four sides of the sealing body MR. In the example shown in FIG. 10, each of the plurality of openings MRH is in the form of a circle in plan view, and the center of the circle overlaps the center line VCL. Note that, in FIG. 10, each of the two openings MRH has a shape which is open toward the short side of the sealing body MR. However, it may also be possible that the openings MRH (through holes) which are closed in plan view are formed inside the short sides of the sealing body MR as long as each of the openings MRH has an aperture area which allows a fixation jig such as a screw to be inserted therethrough.

<Inner Structure>

Figure 13:
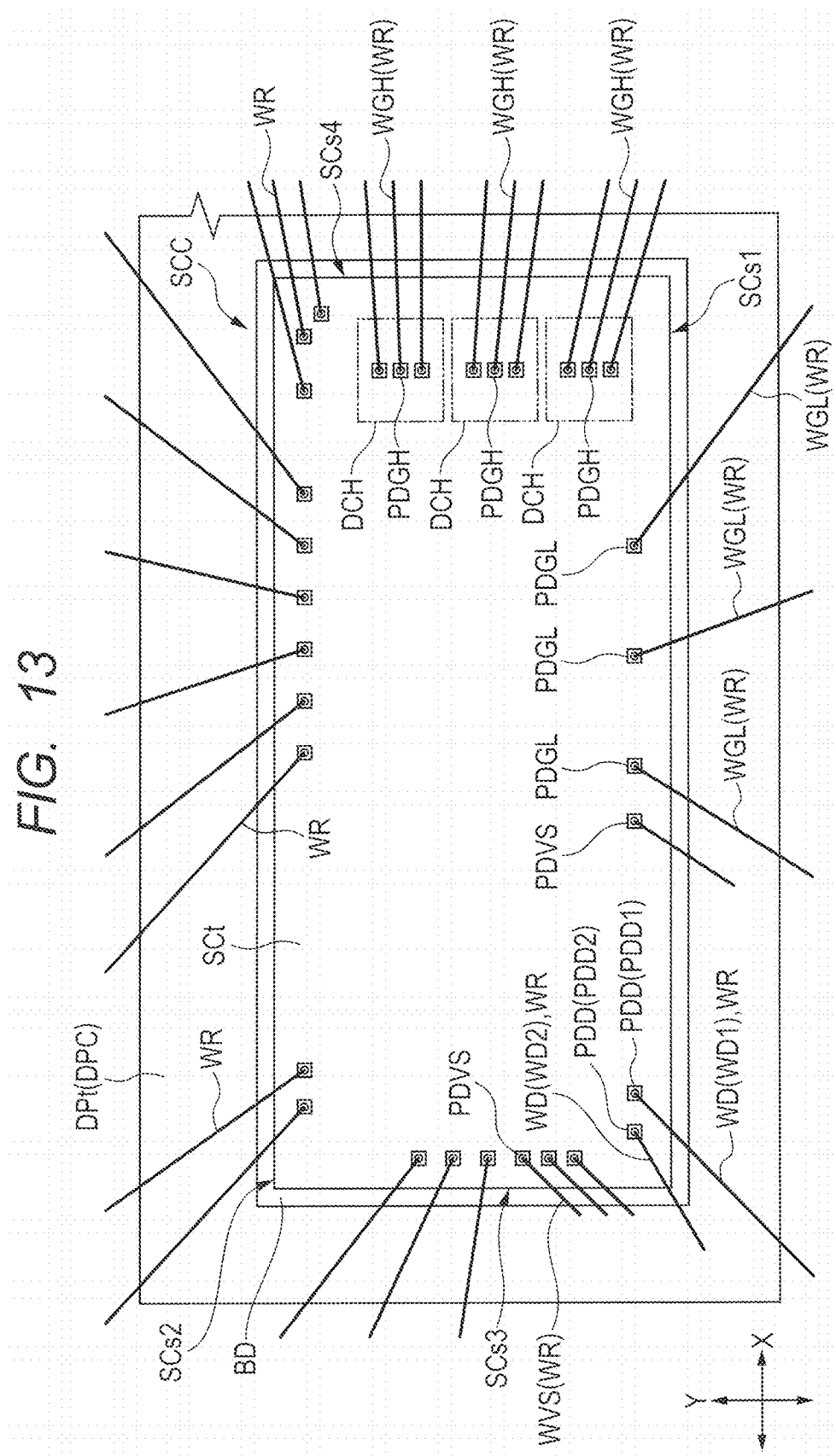
FIG. 13 is a main-portion enlarged plan view showing the periphery of the control semiconductor chip shown in FIG. 12 in enlarged relation.
Figure 14:
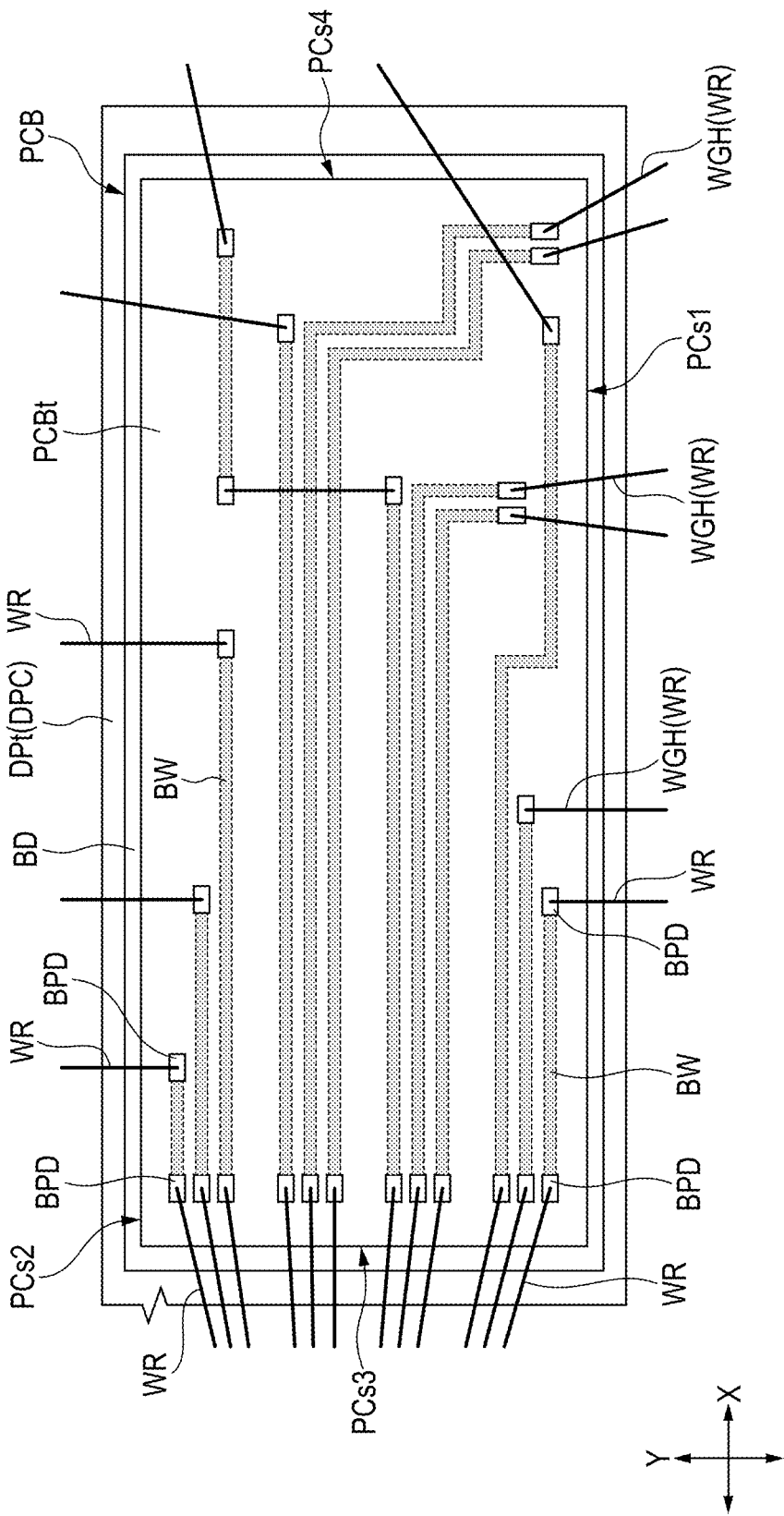
FIG. 14 is a main-portion enlarged plan view showing the periphery of the wiring substrate shown in FIG. 12 in enlarged relation.
Figure 15:
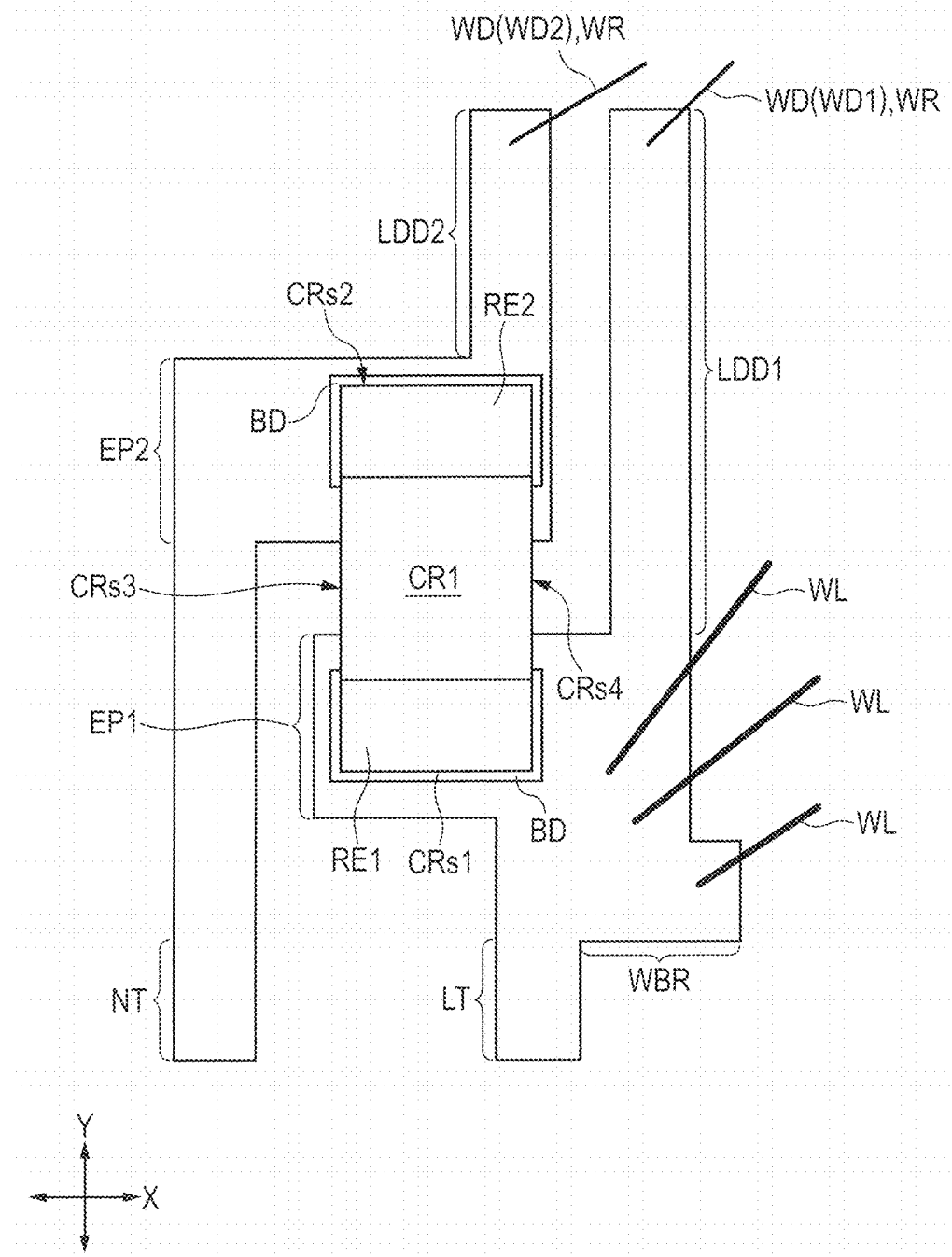
FIG. 15 is an enlarged plan view showing the periphery of the resistive component shown in FIG. 12 in enlarged relation.

Next, a description will be given of the inner layout of the semiconductor device. FIG. 12 is a plan view showing the inner structure of the semiconductor device through the sealing body shown in FIG. 10. FIG. 13 is a main-portion enlarged plan view showing the periphery of the control semiconductor chip shown in FIG. 12 in enlarged relation. FIG. 14 is a main-portion enlarged plan view showing the periphery of the wiring substrate shown in FIG. 12 in enlarged relation. FIG. 15 is an enlarged plan view showing the periphery of the resistive component shown in FIG. 12 in enlarged relation.

The following will describe the electrical coupling relationships between the individual components of the semiconductor device PKG1 described above on the basis of the layout shown in FIG. 12. That is, each of the semiconductor chips SCH1, SCH2, and SCH3 is mounted over a single chip mounting portion (die pad) DPH via a conductive bonding material such as, e.g., a solder. As shown in FIG. 4 already described, over the back surface SCb of each of the semiconductor chips SCH1, SCH2, and SCH3, the collector electrode CP is formed. The chip mounting portion DPH is a conductive member containing a metal such as, e.g., copper (Cu) as a main component and connected to the terminal HT. In the example shown in FIG. 12, the chip mounting portion DPH and the terminal HT are integrally formed. In other words, in the example shown in FIG. 12, each of the chip mounting portion DPH and the terminal HT forms a portion of a single metal plate. Each of the semiconductor chips SCH1, SCH2, and SCH3 is mounted over the chip mounting portion DPH via a conductive bonding material such that the back surface SCb (see FIG. 4) thereof formed with the collector electrode CP (see FIG. 4) faces the chip mounting portion DPH. As a result, the collector electrode CP of each of the semiconductor chips SCH1, SCH2, and SCH3 is coupled to the terminal HT via the chip mounting portion DPH.

Over the chip mounting portion DPH, the three semiconductor chips SC2 are further mounted. As shown in FIG. 7 already described, over the back surface SCb of each of the semiconductor chips SC2, the cathode electrode CDP is formed. Each of the three semiconductor chips SC2 is mounted over the chip mounting portion DPH via a conductive bonding material such that the back surface SCb (see FIG. 7) thereof formed with the cathode electrode CDP (see FIG. 7) faces the chip mounting portion DPH. As a result, the collector electrodes (see FIG. 4) of the semiconductor chips SCH1, SCH2, and SCH3 are electrically coupled to the respective cathode electrodes CDP (see FIG. 7) of the semiconductor chips SC2 mounted over the chip mounting portion DPH.

The emitter electrode EP (see FIG. 4) formed over the top surface SCt (see FIG. 4) of each of the semiconductor chips SCH1, SCH2, and SCH3 is coupled to any of the terminals TU, TV, and TW via a wire WH. In the example shown in FIG. 12, the terminals TU, TV, and TW are connected to respective chip mounting portions DPL as discrete metal plates. In the example shown in FIG. 12, each of a set including the chip mounting portion DPL and the terminal TU, a set including the chip mounting portion DPL and the terminal TV, and a set including the chip mounting portion DPL and the terminal TW is integrally formed. In other words, each of the set including the chip mounting portion DPL and the terminal TU, the set including the chip mounting portion DPL and the terminal TV, and the set including the chip mounting portion DPL and the terminal TW forms a portion of a single metal plate. Each of the metal plates connected to the terminals TU, TV, and TW includes a wire bonding region to which the wire WH is coupled. Each of the plurality of wires WH has one end portion coupled to the emitter electrode EP (see FIG. 4) of the HIGH-side power semiconductor chip and the other end portion coupled to the wire bonding region of the metal plate coupled to the terminal TU, TV, or TW. Each of the plurality of wires WH is coupled at a middle point between the both end portions thereof to the anode electrode ADP (see FIG. 7) of the semiconductor chip SC2. In other words, the emitter electrode EP of each of the HIGH-side power semiconductor chips is coupled to the anode electrode ADP of the semiconductor chip SC2 and to any of the terminals TU, TV, and TW via the wire WH.

The semiconductor chips SCL1, SCL2, and SCL3 are mounted over the three discrete chip mounting portions (die pads) DPL via a conductive bonding material such as, e.g., a solder. As shown in FIG. 4 already described, over the back surface SCb of each of the semiconductor chips SCL1, SCL2, and SCL3, the collector electrode CP is formed. Each of the plurality of chip mounting portions DPL is a conductive member containing a metal such as, e.g., copper (Cu) as a main component and coupled to any of the terminals TU, TV, and TW. The semiconductor chips SCL1, SCL2, and SCL3 are mounted over the respective chip mounting portions DPL via a conductive bonding material such that the back surfaces SCb (see FIG. 4) thereof formed with the collector electrodes CP (see FIG. 4) face the chip mounting portions DPL. As a result, the collector electrode CP of each of the semiconductor chips SCL1, SCL2, and SCL3 is coupled to any of the terminals TU, TV, and TW via the chip mounting portion DPL.

The emitter electrode EP (see FIG. 4) formed over the top surface SCt (see FIG. 4) of each of the semiconductor chips SCL1, SCL2, and SCL3 is coupled to the terminal LT via a wire WL. Each of the metal plates coupled to the terminal LT has a wire bonding region to which the wire WL is coupled. Each of the plurality of wires WL has one end portion coupled to the emitter electrode EP (see FIG. 4) of the LOW-side power semiconductor chip and the other end portion coupled to the wire bonding region of the metal plate coupled to the terminal LT. Each of the plurality of wires WL is coupled at a middle point between the both end portions thereof to the anode electrode ADP (see FIG. 7) of the semiconductor chip SC2. In other words, the emitter electrode EP of each of the LOW-side power semiconductor chips is coupled to the anode electrode ADP of the semiconductor chip SC2 and to the terminal LT via the wire WL.

Each of the plurality of wires WH and the plurality of wires WL is made of, e.g., aluminum. In each of the wires WH and WL, a current higher than that flowing in each of other wires WR flows. Accordingly, the diameters of the wires WH and WL are larger than the diameters of the wires WR coupled to the semiconductor chip SCC. Each of the wires WR coupled to the semiconductor chip SCC is made of, e.g., gold (Au) or copper (Cu). However, in the same manner as for the wires WH and WL, aluminum wires may also be used for the wires WR.

In the Y-direction, each of the six power semiconductor chips (semiconductor chips SCH1, SCH2, SCH3, SCL1, SCL2, and SCL3) is disposed at a position closer to the side MRs1 of the sealing body MR than to the side MRs2 thereof. This allows a reduction in the transmission distance from the emitter electrode or the collector electrode of each of the six power semiconductor chips to each of the plurality of leads LD1 shown in FIG. 10.

The gate electrode of each of the six power semiconductor chips is electrically coupled to the semiconductor chip SCC as the control chip. The respective gate electrodes GP (see FIG. 2) of the semiconductor chips SCL1, SCL2, and SCL3 as the LOW-side power semiconductor chips are coupled individually to pads (electrode pads, electrodes, or surface electrodes) PDGL (see FIG. 13) of the semiconductor chip SCC via respective wires WGL. The pads PDGL are electrode pads exposed at the top surface SCt (see FIG. 13) of the semiconductor chip SCC and coupled to the LOW-side drive circuit DCL shown in FIG. 9. The respective gate electrodes GP (see FIG. 2) of the semiconductor chips SCH1, SCH2, and SCH3 as the HIGH-side power semiconductor chips are coupled individually to pads (electrode pads, electrodes, or surface electrodes) PDGH (see FIG. 13) of the semiconductor chip SCC via respective wires WGH. The pads PDGH are electrode pads exposed at the top surface SCt of the semiconductor chip SCC and coupled to the HIGH-side drive circuit DCH shown in FIG. 9.

In the example shown in FIG. 13, the semiconductor chip SCC is mounted over an upper surface DPt of a chip mounting portion DPC via a bonding material BD. The top surface SCt of the semiconductor chip SCC has a side (long side) SCs1 and a side (long side) SCs2 which are located opposite to each other in plan view, a side (short side) SCs3 extending in a direction crossing the sides SCs1 and SCs2 in plan view, and a side (short side) SCs4 located opposite to the side SCs3 in plan view. The long sides of the semiconductor chip SCC are located so as to extend along the long sides of the sealing body MR shown in FIG. 12. In other words, the semiconductor chip SCC is mounted over the chip mounting portion DPC (see FIG. 12) such that the sides SCs1 and SCs2 of the semiconductor chip SCC extend in the X-direction (see FIG. 12).

The positional relationships between the sides of the semiconductor chip SCC in the semiconductor device PKG1 shown in FIG. 12 can also be expressed as follows. That is, the side SCs2 (see FIG. 13) of the semiconductor chip SCC is located between the side SCs1 (see FIG. 13) and the side MRs2 of the sealing body MR. In other words, the side SCs1 of the semiconductor chip SCC is located between the side SCs2 and the side MRs1 of the sealing body MR. Also, the side SCs3 (see FIG. 13) of the semiconductor chip SCC is located between the side SCs4 (see FIG. 13) and the side MRs3 of the sealing body MR. In other words, the side SCs4 of the semiconductor chip SCC is located between the side SCs3 and the side MRs4 of the sealing body MR.

As shown in FIG. 12, in the case of the semiconductor device PKG1 in the present embodiment, the respective gate electrodes GP (see FIG. 2) of the semiconductor chips SCL1, SCL2, and SCL3 are coupled directly to the pads PDGL (see FIG. 13) of the semiconductor chip SCC via the respective wires WGL. In other words, the respective gate electrodes GP of the semiconductor chips SCL1, SCL2, and SCL3 are coupled to the semiconductor chip SCC without intervention of a wiring substrate PCB. On the other hand, the respective gate electrodes GP (see FIG. 2) of the semiconductor chips SCH1, SCH2, and SCH3 are coupled to the pads PDGH (see FIG. 13) of the semiconductor chip SCC via the wiring substrate PCB. The wiring substrate PCB is a wiring material having a base material made of an insulating material and a plurality of wires BW formed in the foregoing base material. The wiring substrate PCB is mounted over the chip mounting portion DPC so as to be adjacent to the semiconductor chip SCC. Specifically, in plan view, between the wiring substrate PCB and the side MRs3 of the sealing body MR, the semiconductor chip SCC is mounted. In other words, in plan view, the wiring substrate PCB is mounted between the semiconductor chip SCC and the side MRs4 of the sealing body MR.

As shown in FIG. 14, the both end portions of the plurality of wires BW included in the wiring substrate PCB are coupled to bonding pads (pads, bonding leads, or bonding fingers) BPD exposed at an upper surface PCBt of the wiring substrate PCB. The wires BW are covered with an insulating film formed over the upper surface PCBt of the wiring substrate PCB, and the bonding pads BPD are exposed in openings formed in the insulating film. To the plurality of bonding pads BPD, the wires WR are coupled individually. Some of the plurality of wires WR are coupled to the semiconductor chips SCH1, SCH2, and SCH3 shown in FIG. 12. Others of the plurality of wires WR are coupled to those of the plurality of leads LD shown in FIG. 12 which project from the side MRs2 of the sealing body MR. Thus, the wiring substrate PCB is an interposer substrate which electrically couples the semiconductor chip SCC to a component located at a position away from the semiconductor chip SCC.

In the example shown in FIG. 14, the wiring substrate PCB is mounted over the upper surface DPt of the chip mounting portion DPC via the bonding material BD. The upper surface PCBt of the wiring substrate PCB has a side (long side) PCs1 and a side (long side) PCs2 which are located opposite to each other in plan view, a side (short side) PCs3 extending in a direction crossing the sides PCs1 and PCs2 in plan view, and a side (short side) PCs4 located opposite to the side PCs3 in plan view. The long sides of the wiring substrate PCB are located so as to extend along the long sides of the sealing body MR shown in FIG. 12. In other words, the wiring substrate PCB is mounted over the chip mounting portion DPC (see FIG. 12) such that the sides PCs1 and PCs2 of the wiring substrate PCB extend in the X-direction.

In the case of the present embodiment, the semiconductor chip SCC is disposed at a position closer to the side MRs3 of the sealing body MR than to the side MRs4 thereof in the X-direction. On the other hand, each of the semiconductor chips SCH1, SCH2, and SCH3 is disposed at a position closer to the side MRs4 of the sealing body MR than to the MRs3 thereof in the X-direction. Consequently, the distance from the semiconductor chip SCC to each of the HIGH-side power semiconductor chips is relatively longer than the distance from the semiconductor chip SCC to each of the LOW-side power semiconductors chip. Accordingly, in the present embodiment, the wiring substrate PCB is disposed to intervene in the transmission path between the semiconductor chip SCC and the HIGH-side power semiconductor chip. When the semiconductor chip SCC is electrically coupled to the HIGH-side power semiconductor chip via the wiring substrate PCB, compared to the case where the semiconductor chip SCC is coupled directly to the HIGH-side power semiconductor chip via the wire WGH, the distance over which the wire WGH extends can be reduced. As a result, the wire WGH is less likely to be deformed, and therefore it is possible to inhibit the degradation of reliability due to the deformation of the wire WGH. Note that the reason why the semiconductor chip SCC is disposed at a position closer to the side MRs3 of the sealing body MR than to the side MRs4 thereof in the X-direction will be described later.

The semiconductor chip SCC is coupled to the terminals (leads or outer leads) TH1, TH2, and TH3 among the plurality of leads LD exposed from the side MRs2 of the sealing body MR to which the HIGH-side control input signal is supplied. The semiconductor chip SCC is also coupled to the terminals (leads or outer leads) TL1, TL2, and TL3 among the plurality of leads LD exposed from the side MRs2 of the sealing body MR to which the LOW-side control input signal is supplied. The semiconductor chip SCC is electrically coupled to each of the terminals TL1, TL2, and TL3 as the LOW-side input terminals via the wire WR (see FIG. 13). The semiconductor chip SCC is also electrically coupled to each of the terminals TH1, TH2, and TH3 as the HIGH-side input terminals via the wire WR (see FIG. 13) and the wiring substrate PCB.

The plurality of leads LD exposed from the side MRs2 of the sealing body MR include the terminal (lead or outer lead) VDD to which a low-voltage power supply potential is supplied. The terminal VDD is electrically coupled to the semiconductor chip SCC via the wire WR (see FIG. 13).

In the Y-direction, the semiconductor chip SCC is disposed at a position closer to the side MRs2 of the sealing body MR than to the side MRs1 thereof. This can reduce the respective transmission distances from the plurality of electrodes formed over the top surface SCt of the semiconductor chip SCC to the plurality of leads LD2 shown in FIG. 10.

The plurality of leads LD exposed from the side MRs2 of the sealing body MR also include the plurality of terminals (leads or outer leads) VFB to which a potential used for the generation of the HIGH-side gate voltage is supplied. Each of the plurality of terminals VFB is electrically coupled to the semiconductor chip SCC via the wiring substrate PCB and the wire WR (see FIG. 13). The plurality of leads LD exposed from the side MRs2 of the sealing body MR also include the terminals (leads or outer leads) VSS to which the reference potential is supplied. The terminals VSS are coupled to the chip mounting portion DPC. Among the plurality of electrode pads included in the semiconductor chip SCC, a pad (electrode pad, electrode, or surface electrode) PDVS (see FIG. 13) to which the reference potential is supplied is coupled to the chip mounting portion DPC via a wire WVS (see FIG. 13). By thus coupling the chip mounting portion DPC to the terminals VSS and supplying the reference potential to the entire chip mounting portion DPC, the pad PDVS can be provided at any position on the top surface SCt (see FIG. 13) of the semiconductor chip SCC.

As described above, the semiconductor device PKG1 in the present embodiment includes the resistive component (electronic component) CR1 including the resistive element R1 operating as the shunt resistor. The resistive component CR1 includes the electrode RE1, the electrode RE2 located opposite to the electrode RE1 in plan view, and the resistive element R1 (see FIG. 9) coupled to both of the electrodes RE1 and RE2. As shown in FIG. 15, the resistive component CR1 has an oblong (rectangular) two-dimensional shape and has a side (long side) CRs3 and a side (long side) CRs4 which are located opposite to each other, a side (short side) CRs1 extending in a direction crossing the sides CRs3 and CRs4, and a side (short side) CRs2 located opposite to the side CRs1. The electrode RE1 is disposed closer to the side CRs1 as the end portion of one of the two long sides of the resistive component CR1. The electrode RE2 is disposed closer to the side CRs2 as the end portion of the other of the two long sides of the resistive component CR1.

The electrodes RE1 and RE2 are mounted over two discrete component mounting portions (pads) EP1 and EP2 via the conductive bonding material BD. Specifically, the electrode RE1 is adhesively fixed onto the component mounting portion EP1 via the bonding material BD. The electrode RE2 is adhesively fixed onto the component mounting portion EP2 via the bonding material BD. The bonding material BD is a conductive adhesive material which is, e.g., a resin material containing a large number of conductive grains. Examples of the resin material of the conductive adhesive material include a thermosetting resin component such as an epoxy-based resin. Examples of the conductive grains include silver (Ag) grains.

The component mounting portion EP2 is a conductive member containing a metal such as, e.g., copper (Cu) as a main component and is connected to the terminal (lead or outer lead) NT coupled to the ground potential (grounding potential). That is, the electrode RE2 of the resistive component CR1 is coupled to the terminal NT via the bonding material BD and the component mounting portion EP2. The component mounting portion EP2 is also connected to a lead (inner lead) LDD2 extending in the Y-direction crossing the X-direction. To a portion (e.g., tip portion) of the lead LDD2, a wire WD2 is coupled. The lead LDD2 is coupled to a pad (electrode, electrode pad, or measurement pad) PDD2 of the semiconductor chip SCC shown in FIG. 13 via the wire WD2. That is, the electrode ER2 of the resistive component CR1 is coupled to the pad PDD2 via the bonding material BD, the component mounting portion EP2, the lead LDD2, and the wire WD2.

The component mounting portion EP1 is a conductive member containing a metal such as, e.g., copper (Cu) as a main component. The component mounting portion EP1 is connected to the LOW-side terminal LT to which a potential relatively lower than that in each of the phases of the 3-phase induction motor MT (see FIG. 1) is supplied. That is, the electrode RE1 of the resistive component CR1 is coupled to the terminal LT via the bonding material BD and the component mounting portion EP1.

The component mounting portion EP1 is connected to a wire bonding region WBR (see FIG. 15) located between the component mounting portion EP1 and the chip mounting portion DPL (see FIG. 12) in the X-direction. To the wire bonding region WBR, the wire WL coupled to the semiconductor chip SCL1 (see FIG. 12), the wire WL coupled to the semiconductor chip SCL2 (see FIG. 12), and the wire WL coupled to the semiconductor chip SCL3 (see FIG. 12) are coupled. That is, the electrode RE1 of the resistive component CR1 is coupled to the semiconductor chips SC11, SCL2, and SCL3 via the bonding material BD, the component mounting portion EP1, the wire bonding region WBR, and the plurality of wires WL. The component mounting portion EP1 is coupled to a lead (inner lead) LDD1 extending in the Y-direction crossing the X-direction. To a portion (e.g., tip portion) of the lead LDD1, a wire WD1 is coupled. The lead LDD1 is coupled to a pad (electrode, electrode pad, or measurement pad) PDD1 of the semiconductor chip SCC shown in FIG. 13 via the wire WD1. That is, the electrode RE1 of the resistive component CR1 is coupled to the pad PDD1 via the bonding material BD, the component mounting portion EP1, the lead LDD1, and the wire WD1.

Two pads PDD (electrodes, electrode pads, or measurement pads) including the pads PDD1 and PDD2 shown in FIG. 13 are electrodes coupled to the detection circuit DTC of the semiconductor chip SCC shown in FIG. 9. Accordingly, each of the electrodes RE1 and RE2 of the resistive component CR1 is coupled to the detection circuit shown in FIG. 9 via the pad PDD.

<Relationship Between Component Layout and Accuracy of Detecting Current>

Next, a description will be given of the relationship between a component layout shown in FIG. 12 and the accuracy of detecting a current flowing in the semiconductor device PKG1. In terms of improving the accuracy of detecting the current flowing in the resistive component CR1 shown in FIG. 9, it is preferable to reduce the path length of each of the following two transmission paths.

One of the foregoing two transmission paths is the transmission path from the emitter electrode of each of the LOW-side power semiconductor chips to the electrode RE1 of the resistive component CR1 (the path is hereinafter referred to as the first transmission path). In the example shown in FIG. 12, the wire WL and the path from the wire bonding region WBR to the electrode RE1 shown in FIG. 15 corresponds to the first transmission path. By reducing the path length of the first transmission path, an inductance component and a resistance component in the path can be reduced. This can reduce noise to the current flowing in the first transmission path.

In the case of the present embodiment, as shown in FIG. 12, the component CR1, the plurality of LOW-side power semiconductor chips (semiconductor chips SCL3, SCL2, and SCL1), and the plurality of HIGH-side power semiconductor chips (semiconductor chips SCH3, SCH2, and SCH1) are arranged in order of increasing distance from the side MRs3 of the sealing body MR toward the side MRs4 thereof in the X-direction. In other words, the plurality of LOW-side power semiconductor chips (semiconductor chips SCL3, SC12, and SCL1) are arranged adjacent to each other, and the resistive component CR1 is disposed adjacent thereto. In still other words, between the plurality of LOW-side power semiconductor chips (semiconductor chips SCL3, SCL2, and SCL1) and the resistive component CR1, no HIGH-side power semiconductor chip is disposed.

As an example studied for comparison with the layout shown in FIG. 12, a layout can be considered in which the LOW-side power semiconductor chips and the HIGH-side power semiconductor chips are alternately arranged in the X-direction. In this case, it follows that the HIGH-side power semiconductor chips are interposed between some of the LOW-side power semiconductor chips and the resistive component CR1. As a result, the lengths of the wires WL shown in FIG. 12 are increased. By contrast, according to the present embodiment, no HIGH-side power semiconductor chip is disposed between the plurality of LOW-side power semiconductor chips and the resistive component CR1. This can reduce the respective lengths of the plurality of wires WL.

In the case of the semiconductor device PKG1 shown in FIG. 12, in plan view, none of the plurality of wires WL overlaps the metal plate coupled to the terminal HT. As described above, the terminal HT which supplies a high power supply potential is likely to serve as a noise source. However, when none of the plurality of wires WL overlaps the metal plate coupled to the terminal HT, it is possible to reduce the noise influence exerted by the high power supply potential on the plurality of wires WL.

The other one of the two transmission paths described above is a transmission path from each of the electrodes RE1 and RE2 of the resistive component CR1 to the detection circuit DTC shown in FIG. 9 (the path is hereinafter referred to as the second transmission path). In the example shown in FIG. 12, the leads LDD1 and LDD2, the wires WD, and the length of the internal circuit of the semiconductor chip SCC correspond to the second transmission path. As described above, in the detection circuit DTC, the voltage between the electrodes RE1 and RE2 is measured. Accordingly, compared to the case where the current value is directly measured, the noise influence exerted by the transmission distance is relatively small. However, since the signal level is low until the signal is input to the amplification circuit AP1 (or amplification circuit AP2) shown in FIG. 9, it is necessary to reduce the noise to the pre-amplification signal. Therefore, it is preferable to reduce the length of the second transmission path and thus reduce the inductance component and the resistance component in the path.

In the case of the present embodiment, as shown in FIG. 12, the semiconductor chip SCC is disposed at a position closer to the side MRs3 of the sealing body MR than to the side MRs4 thereof in the X-direction. In other words, the semiconductor chip SCC is disposed so as to be closer to the resistive component CR1, though the distances from the plurality of HIGH-side power semiconductor chips to the semiconductor chip SCC increase. This can reduce each of the distance over which the lead LDD1 extends, the distance over which the lead LDD2 extends, the distance over which the wire WD1 (see FIGS. 13 and 15) extends, and the distance over which the wire WD2 (see FIGS. 13 and 15) extends. In other words, it is possible to reduce the path length of the second transmission path described above.

Thus, according to the present embodiment, it is possible to reduce the path length of each of the first and second transmission paths described above. This allows an improvement in the accuracy of detecting the current flowing in the inverter circuit included in the semiconductor device PKG1. As a result, the reliability of the signal measured by the detection circuit is improved, and therefore it is possible to inhibit erroneous detection of an overcurrent and feedback control based on erroneous data.

Note that the signal output from the amplification circuit AP1 (or amplification circuit AP2) shown in FIG. 9 has noise resistance higher than that of the signal input to the amplification circuit AP1 (or amplification circuit AP2). Accordingly, the transmission path for the signal output from the detection circuit DTC may be longer than each of the first and second transmission paths described above. In the example shown in FIG. 12, the distance over which the metal plate (lead) including the terminal SDT extends is longer than each of the distances over which the leads LDD1 and LDD2 shown in FIG. 15 extend. However, when there is no layout constraint, the transmission distance of each of the signal transmission paths is preferably shorter. Accordingly, for example, the distance over which the metal plate (lead) including the terminal SDT extends may be shorter than each of the distances over which the leads LDD1 and LDD2 shown in FIG. 15 extend.

In the example shown in FIG. 12, the resistive component CR1 is disposed such that the long sides of the resistive component CR1 extend in directions crossing the long sides of the sealing body MR. In other words, the resistive component CR1 is mounted over the component mounting portions EP1 and EP2 (see FIG. 15) such that each of the sides CRs3 and CRs4 as the two long sides of the resistive component CR1 extends in a direction crossing the X-direction. In the example shown in FIG. 15, each of the sides CRs3 and CRs4 extends along the Y-direction orthogonal to the X-direction. Also, in plan view, the resistive component CR1 is mounted over the component mounting portions EP1 and EP2 such that the electrode RE2 is located closer to the semiconductor chip SCC than the electrode RE1. In this case, it is possible to reduce the transmission distance from the electrode RE2 to the semiconductor chip SCC.

In terms of reducing the distance over which each of the wires WD shown in FIG. 12 extends, it is preferable to locate the positions of the pads PDD (see FIG. 13) coupled to the wires WD closer to the resistive component CR1 over the top surface SCt (see FIG. 13) of the semiconductor chip SCC. In the case of the present embodiment, as shown in FIG. 13, each of the pad PDD1 coupled to the wire WD1 and the pad PDD2 coupled to the wire WD2, which are among the plurality of pads (electrodes) formed over the top surface SCt of the semiconductor chip SCC, is disposed at a position over the top surface SCt closer to the side SCs3 than to the side SCs4. Each of the pads PDD1 and PDD2 is also disposed at a position over the top surface SCt closer to the side SCs1 than to the side SCs2.

In plan view, the resistive component CR1 is located closer to the side MRs1 of the sealing body MR than to the center line VCL (see FIG. 10) connecting the respective middle points of the sides MRs3 and MRs4 thereof. In this case, it is possible to reduce each of the distance from the resistive component CR1 to the terminal LT and the distance from the resistive component CR1 to the terminal NT.

Figure 16:
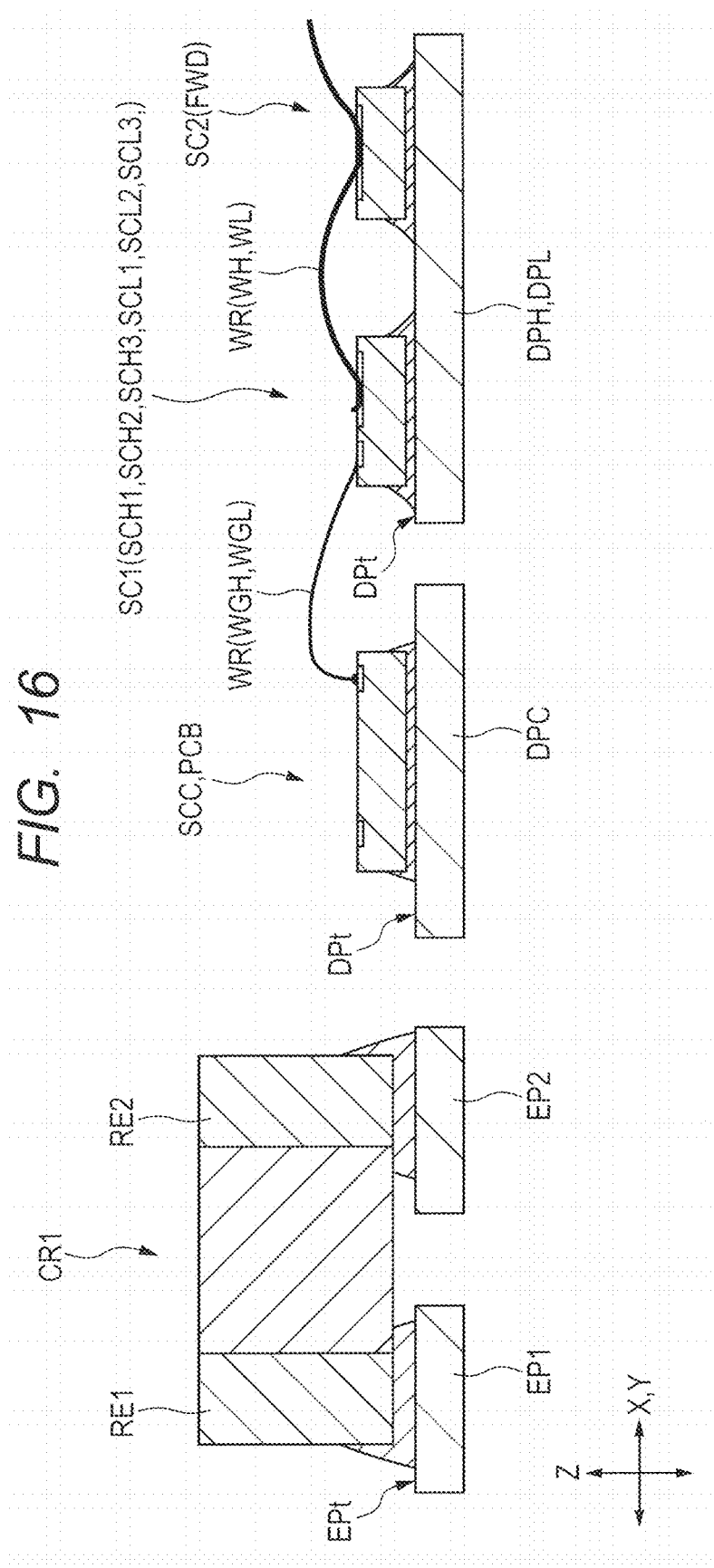
FIG. 16 is a main-portion cross-sectional view showing the respective thicknesses of the plurality of semiconductor chips, the wiring substrate, and the resistive component which are shown in FIG. 12 for the sake of comparison.

As shown in FIG. 16, in a thickness direction (Z-direction) orthogonal to an X-Y plane including the X-direction and the Y-direction, the thickness of the resistive component CR1 is larger than the respective thicknesses of the plurality of power semiconductor chips (semiconductor chips SCH1, SCH2, SCH3, SCL1, SCL2, and SCL3) and the semiconductor chip SCC. FIG. 16 is a main-portion cross-sectional view showing the respective thicknesses of the plurality of semiconductor chips, the wiring substrate, and the resistive component which are shown in FIG. 12. In the example shown in FIG. 16, the respective thicknesses of the semiconductor chips SCH1, SCH2, SCH3, SCL1, SCL2, and SCL3 are about 200 to 300 μm. The respective thicknesses of the semiconductor chip SCC and the wiring substrate PCB are also about 200 to 300 μm. On the other hand, the thickness of the resistive component CR1 is about 1 mm, which is not less than triple the thickness of each of the power semiconductor chips and the wiring substrate PCB. As shown in FIG. 16, the heights of the wire loops of the wires WGH and WGL are lower than the height of the resistive component CR1. The heights of the wire loops of the wires WH and WL are also lower than the height of the resistive component CR1. Note that the height of each of the wire loops mentioned above is the distance from the upper surface DPt of the chip mounting portion DPC (or chip mounting portion DPH or DPL) serving as a reference surface to the highest point reached by the wire. The height of the resistive component CR1 is the distance from an upper surface EPt of the component mounting portion EP1 serving as a reference surface to the portion of the resistive component CR1 furthest away from the upper surface EPt in the Z-direction.

As shown in FIG. 16, when the thickness of the resistive component CR1 is particularly large compared to those of the other electronic components, it is preferable that the resistive component CR1 is not interposed between the electronic components electrically coupled to each other via the wires WR. When the resistive component CR1 is not interposed between the electronic components electrically coupled to each other via the wires WR, it is possible to reduce the heights of the wire loops, as shown in FIG. 16.

This can inhibit the wires WR from being deformed. This can also reduce the length of the transmission path formed of each of the wires WR.

As shown in FIG. 12, the resistive component CR1 is located closer to the side MRs1 than the center line VCL (see FIG. 10) connecting the respective middle points of the sides MRs3 and MRs4 of the sealing body MR. Also, in the X-direction, the resistive component CR1, the plurality of LOW-side power semiconductor chips, and the plurality of HIGH-side power semiconductor chips are arranged in order of increasing distance from the side MRs3 of the sealing body MR toward the side MRs4 thereof. Each of the semiconductor chip SCC and the wiring substrate PCB is located closer to the side MRs2 than the center line VCL (see FIG. 10). Consequently, between each of the semiconductor chip SCC and the wiring substrate PCB and the power semiconductor chips, the resistive component CR1 is not interposed.

Also, as shown in FIG. 12, one of the two openings MRH formed in the sealing body MR is located along the side MRs3 of the sealing body MR (in the vicinity of the side MRs3). The other of the two openings MRH formed in the sealing body MR is located along the side MRs4 of the sealing body MR (in the vicinity of the side MRs4). As described using FIG. 10, each of the two openings MRH overlaps the center line VCL. Accordingly, in terms of reducing the two-dimensional size of the semiconductor device PKG1, the resistive component CR1 is preferably disposed so as not to overlap the center line VCL (see FIG. 10), as shown in FIG. 12.

On the other hand, the distances from the semiconductor chips SCH1, SCH2, SCH3, SCL1, SCL2, and SCL3 as the power semiconductor chips to the semiconductor chip SCC and the wiring substrate PCB are preferably shorter. Accordingly, each of these power semiconductor chips is preferably disposed close to the center line VCL shown in FIG. 10 in plan view.

In the example shown in FIG. 12, in plan view, each of the semiconductor chips SCH1, SCH2, SCH3, SCL1, SCL2, and SCL3 is disposed between the opening MRH located closer to the side MRs3 of the sealing body MR and the opening MRH located closer to the side MRs4 thereof. Each of the semiconductor chips SCH1, SCH2, SCH3, SCL1, SCL2, and SCL3 is also disposed between a region located between and connecting the two openings MRH and the side MRs1 of the sealing body MR.

<Method of Manufacturing Semiconductor Device>

Figure 17:
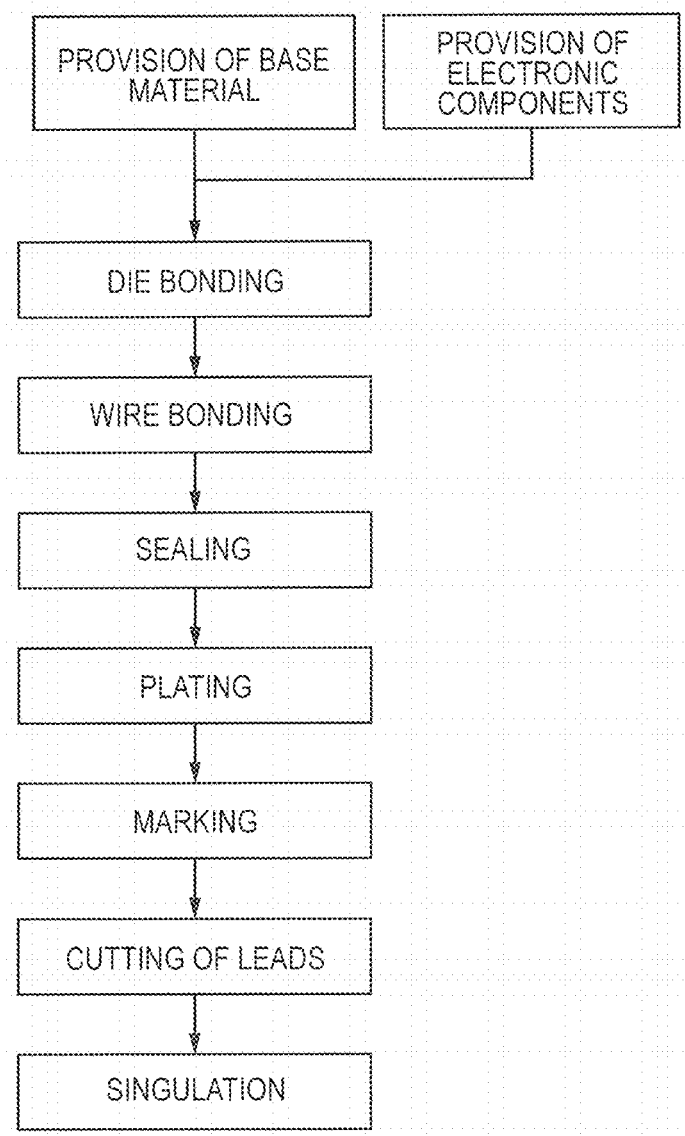
FIG. 17 is an illustrative view showing an assembly flow for the semiconductor device in the embodiment.

Next, a description will be given of a method of manufacturing the semiconductor device PKG1 described using FIGS. 1 to 16. FIG. 17 is an illustrative view showing an assembly flow for the semiconductor device in the present embodiment. The semiconductor device PKG1 in the present embodiment is manufactured in accordance with the assembly flow shown in FIG. 17.

<Base Material Provision Step>

Figure 18:
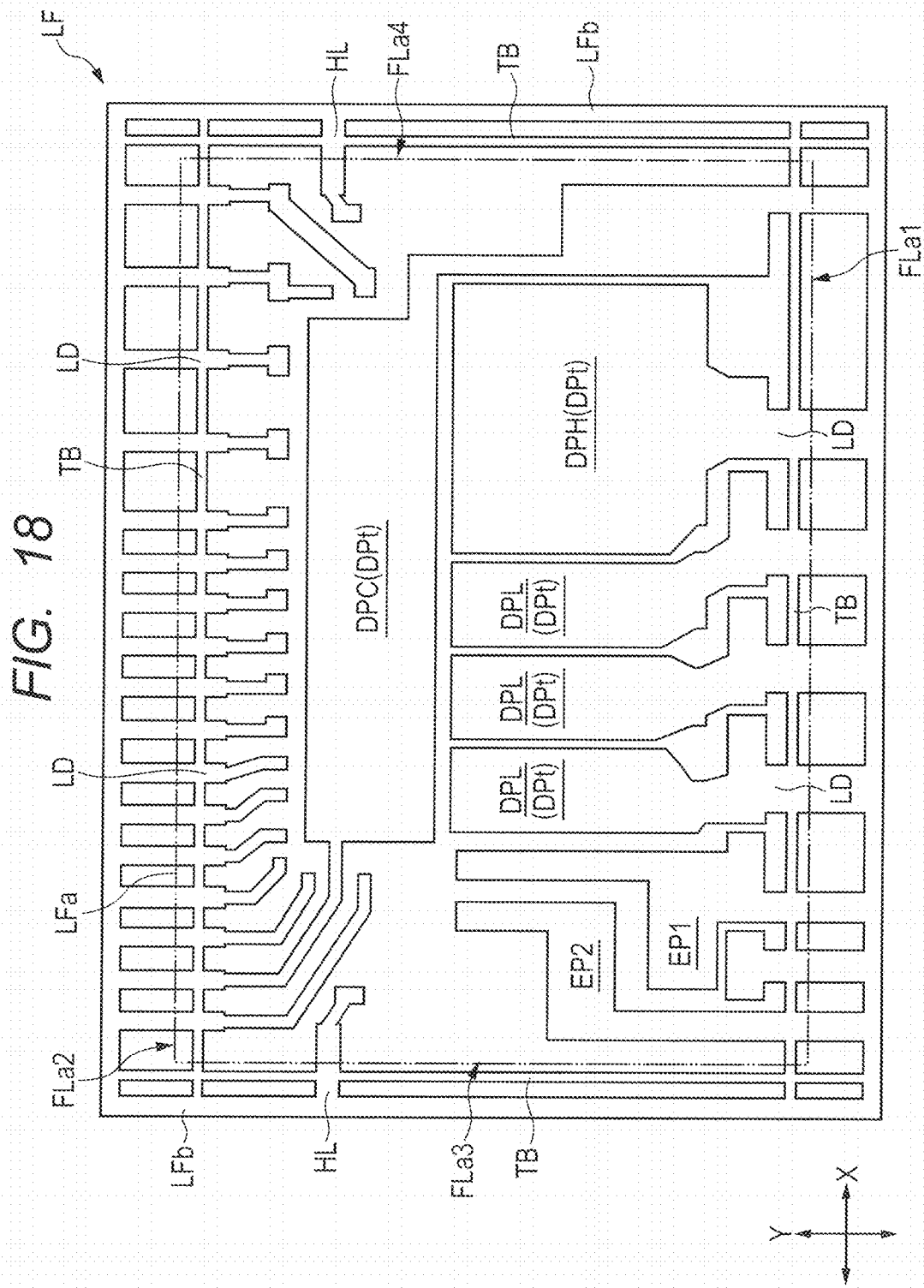
FIG. 18 is an enlarged plan view showing a portion of a lead frame which is provided in the base material provision step shown in FIG. 17.

In the base material provision step shown in FIG. 17, a lead frame (base material) LF shown in FIG. 18 is provided. FIG. 18 is an enlarged plan view showing a portion of the lead frame provided in the base material provision step shown in FIG. 17.

The lead frame LF provided in the present step includes a plurality of device formation portions LFa inside a frame portion LFb. The lead frame LF is made of a metal. In the present embodiment, the lead frame LF is made of, e.g., a metal containing copper (Cu) as a main component.

Note that the present embodiment will describe an example in which, as shown in FIG. 17, a plating step is performed after a sealing step to form a metal film (outer lead frame plating film) over the outer lead portions of the plurality of leads LD. However, in a modification, it may also be possible that the top surface of the base material containing copper as a main component is covered in advance with a metal film at the stage of the base material provision step. In this case, the entire exposed surface of the lead frame LF is covered with the metal film.

As also shown in FIG. 18, at the center portion of each of the device formation portions LFa, the chip mounting portion DPH, the plurality of chip mounting portions DPL, the chip mounting portion DPC, and the component mounting portions EP1 and EP2 are formed. Each of the chip mounting portion DPH, the plurality of chip mounting portions DPL, and the component mounting portions EP1 and EP2 is coupled to any of the plurality of leads LD and supported by the frame portion LFb via the lead LD. To the frame portion LFb, the suspension leads HL are coupled, and each of the suspension leads HL has a portion extending toward the inside of the device formation portion LFa. The suspension leads HL are supporting members which support the sealing body MR after the plurality of leads LD are cut till a singulation step.

As shown in FIG. 18, each of the device formation portions LFa of the lead frame LF has a side (long side) LFa1 extending along the X-direction in plan view, a side (long side) LFa2 located opposite to the side LFa1, a side (short side) LFa3 extending along the Y-direction crossing the X-direction (orthogonal thereto in FIG. 18), and a side (short side) LFa4 located opposite to the side LFa3. The sides LFa1 and LFa2 are relatively long compared to the sides LFa3 and LFa4.

In the X-direction, the component mounting portion EP1 (and the component mounting portion EP2), the plurality of chip mounting portions DPL, and the single chip mounting portion DPH are arranged along the side LFa1 in order of increasing distance from the side LFa3 toward the side LFa4. Between the side LFa2 and each of the plurality of chip mounting portions DPL and the single chip mounting portion DPH, the chip mounting portion DPC is disposed along the side LFa2. Over and across each of the sides LFa1 and LFa2, the plurality of leads LD extend. Also, over and across each of the sides LFa3 and LFa4, the suspension leads HL extend, but the plurality of leads LD do not extend.

The plurality of leads LD are connected to each other via a tie bar TB. The tie bar TB has not only the function of a connecting member which connects the plurality of leads LD, but also the function of a dam member which inhibits a resin from leaking out in the sealing step shown in FIG. 17.

<Electronic Component Provision Step>

In an electronic component provision step shown in FIG. 17, the power semiconductor chip SC1 as the power semiconductor chip described using FIGS. 2 to 4, the semiconductor chip SC2 described using FIGS. 5 to 7, the semiconductor chip SCC shown in FIG. 13, the wiring substrate PCB shown in FIG. 14, and the resistive component CR1 shown in FIG. 15 are provided.

Each of the semiconductor chips SC1, SC2, and SCC is provided by providing a wafer in which integrated circuits are formed, dicing the wafer to singulate the chip regions formed in the wafer, and thus obtaining the plurality of semiconductor chips from the wafer.

The wiring substrate PCB shown in FIG. 14 is acquired as follows. For example, after the plurality of wires BW and the plurality of bonding pads BPD each shown in FIG. 14 are formed over the wiring substrate, an insulating film is formed so as to cover the wires BW and the bonding pads BPD. Then, a plurality of openings are formed in the insulating film to expose the bonding pads BPD and thus provide the wiring substrate PCB.

The resistive component CR1 shown in FIG. 15 is acquired by coupling the electrodes RE1 and RE2 to the both ends of a resistor having a known resistance value. Note that, as the resistive component CR1, a versatile product can also be used. In this case, the resistive component CR1 is acquired by purchasing the externally manufactured resistive component CR1. It may also be possible to purchase each of the wiring substrate PCB and the semiconductor chips SC1, SC2, and SCC.

In the present embodiment, the base material provision step is described first, and then the electronic component provision step is described. However, either of the base material provision step and the electronic component provision step may be performed first, or both of the base material provision step and the electronic component provision step may be performed simultaneously. The die bonding step is performed after each of the base material provision step and the electronic component provision step is completed.

<Die Bonding Step>

Figure 19:
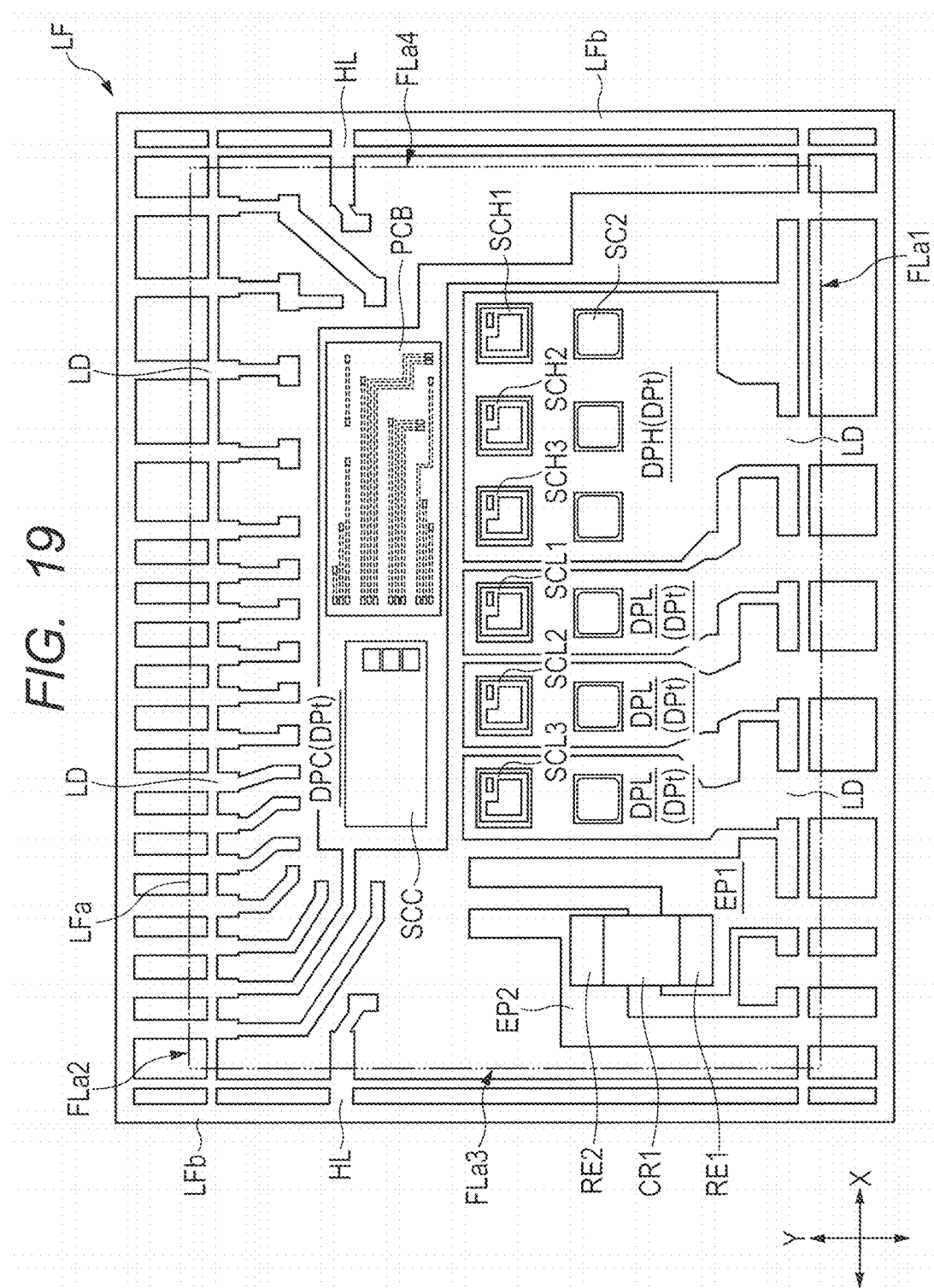
FIG. 19 is an enlarged plan view showing the state where respective electronic components are mounted over the plurality of chip mounting portions and component mounting portions of the lead frame shown in FIG. 18.

In the die bonding step (semiconductor chip mounting step) shown next in FIG. 17, as shown in FIG. 19, the electronic components provided in the electronic component provision step are mounted over the chip mounting portions DPH, DPL, and DPC and the component mounting portions EP1 and EP2, as shown in FIG. 19. FIG. 19 is an enlarged plan view showing the state where the individual electronic components are mounted over the plurality of chip mounting portions and the component mounting portions of the lead frame shown in FIG. 18.

In the present step, over the upper surface DPt of the chip mounting portion DPH, the semiconductor chips SCH1, SCH2, and SCH3 and the three semiconductor chips SC2 are mounted. In addition, over the respective upper surfaces DPt of the plurality of chip mounting portions DPL, the semiconductor chips SCL1, SCL2, and SCL3, and the three semiconductor chips SC2 are mounted. Each of the semiconductor chips SCH1, SCH2, SCH3, SCL1, SCL2, SCL3, and SC2 is mounted over the chip mounting portion via a conductive bonding material (such as, e.g., a high-melting-point solder having a melting point of about 300° C.). As a result, the respective collector electrodes of the plurality of power semiconductor chips are electrically coupled to the leads LD via the chip mounting portion. Also, the respective cathode electrodes of the semiconductor chips SC2 are electrically coupled to the collector electrodes of the power semiconductor chips and to the leads LD via the chip mounting portions. When a plurality of types of materials such as a solder and a conductive adhesive material are used as the conductive bonding material, electronic components using a material (e.g., solder) which requires high-temperature treatment are mounted first. In the case of the present embodiment, the power semiconductor chips and the semiconductor chips SC2 including diodes and coupled thereto use a solder. Accordingly, these semiconductor chips are mounted first.

Next, the semiconductor chip SCC and the wiring substrate PCB are each mounted over the chip mounting portion DPC via the bonding material BD (see FIGS. 13 and 14) as the conductive adhesive material. The resistive component CR1 is mounted over the component mounting portions EP1 and EP2 via the bonding material BD (see FIG. 15) as the conductive adhesive material. Specifically, the electrode RE1 of the resistive component CR1 is coupled to the component mounting portion EP1, while the electrode RE2 of the resistive component CR1 is coupled to the component mounting portion EP2. In the case of using the conductive adhesive material, the individual electronic components are temporarily fixed onto the mounting portions via the conductive adhesive material, and then the resin component contained in the conductive adhesive material is thermally cured. As a result, the individual electronic components are fixed onto the mounting portions and electrically coupled to the leads LD via the mounting portions.

<Wire Bonding Step>

Figure 20:
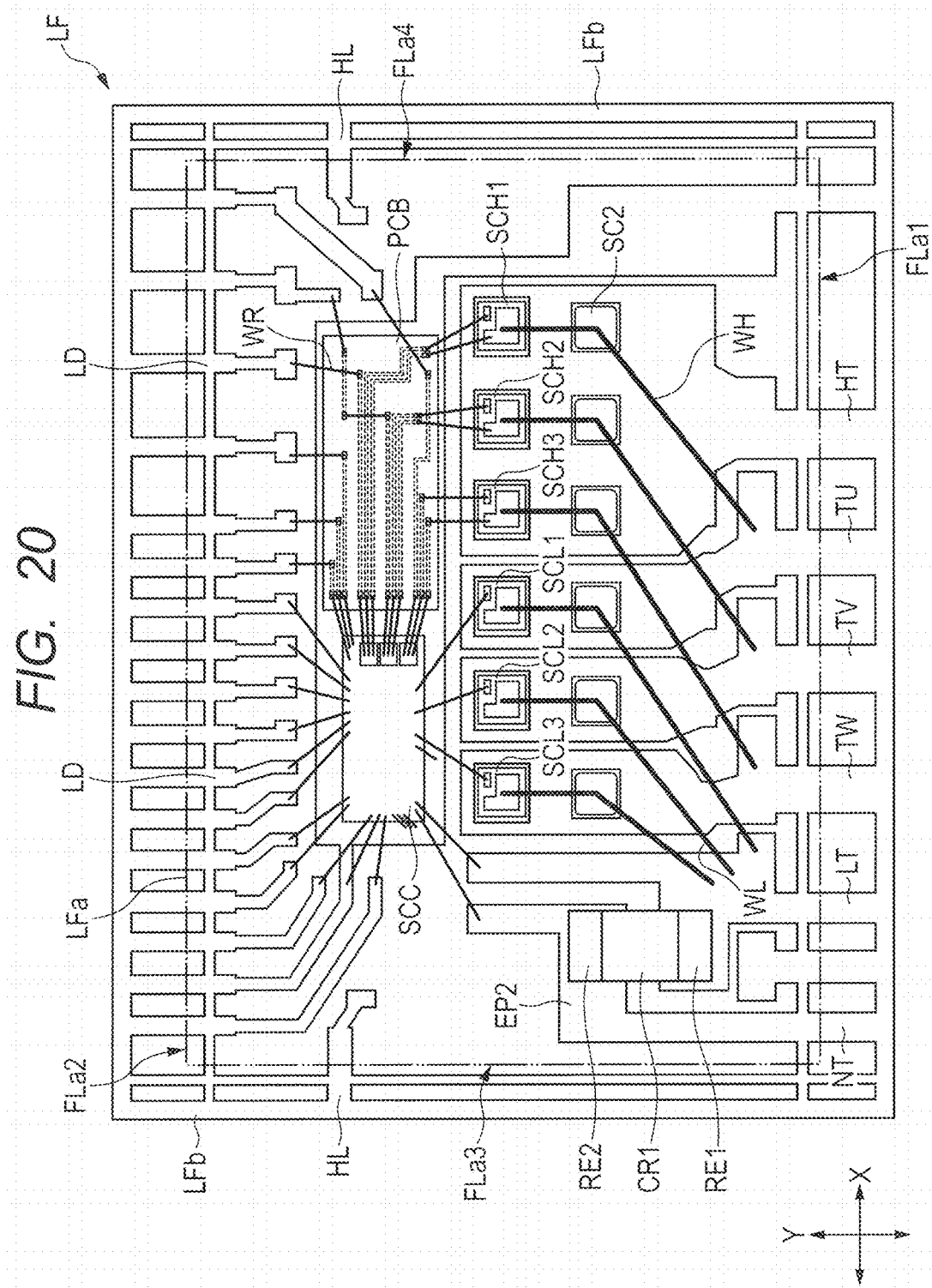
FIG. 20 is an enlarged plan view showing the lead frame after the wire bonding step shown in FIG. 17 is ended.

Next, in a wire bonding step shown in FIG. 17, the wires WR are coupled as shown in FIG. 20 to electrically couple the electronic components to each other or the electronic components to the leads LD. FIG. 20 is an enlarged plan view showing the lead frame after the wire bonding step shown in FIG. 17 is ended.

In the present step, the emitter electrodes EP (see FIG. 2) formed over the respective top surfaces SCt (see FIG. 2) of the semiconductor chips SCH1, SCH2, and SCH3 are coupled to the respective anode electrodes ADP (see FIG. 5) of the semiconductor chips SC2 and to the respective terminals TU, TV, and TW via the wires WH. On the other hand, the emitter electrodes EP (see FIG. 2) formed over the respective top surfaces SCt (see FIG. 2) of the semiconductor chips SCL1, SCL2, and SCL3 are coupled to the respective anode electrodes ADP (see FIG. 5) of the semiconductor chips SC2 and to the wire bonding region WBR (see FIG. 15) coupled to the terminal LT via the wires WL. Each of the wires WH and WL is made of, e.g., aluminum and bonded by a wedge bonding method (referred to also as a stitch bonding method). The wedge bonding method allows one wire to be bonded at three or more locations. Accordingly, in the case of electrically coupling the semiconductor chip SC1 (see FIG. 2) as the power semiconductor chip, the semiconductor chip SC2, and the wire bonding region of the lead frame LF to each other as coupled using each of the wires WH and WL, the wedge bonding method is appropriate.

In the present step, the respective gate electrodes GP (see FIG. 2) of the semiconductor chips SCL1, SCL2, and SCL3 are coupled to the pads PDGL (see FIG. 13) of the semiconductor chip SCC via the wires WGL (see FIG. 12). On the other hand, the respective gate electrodes GP (see FIG. 2) and emitter electrodes EP (see FIG. 2) of the semiconductor chips SCH1, SCh2, and SCH3 are coupled to the bonding pads BPD (see FIG. 14) of the wiring substrate PCB via the wires WGH (see FIG. 12). The plurality of pads PDGH (see FIG. 13) of the semiconductor chip SCC are coupled individually to the bonding pads BPD (see FIG. 14) of the wiring substrate PCB via the wires WGH (see FIG. 13). Also, the plurality of pads PDD of the semiconductor chip SCC are coupled individually to the leads LDD1 and LDD2 shown in FIG. 15 via the wires WD. The other electrode pads of the semiconductor chip SCC are electrically coupled to the chip mounting portion DPC and the leads LD via the wires WR. On the other hand, the bonding pads BPD of the wiring substrate PCB are electrically coupled to the leads LD via the wires WR.

Each of the wires WR coupled to the semiconductor chip SCC and the wiring substrate PCB has a diameter smaller than that of each of the wires WL and WH. Each of the wires WR is made of gold (Au), copper (Cu), or aluminum (Al) and bonded by a bonding method using, e.g., a bonding tool referred to as a capillary. Note that the wedge bonding method described above can also be used even when the wire is bonded at two locations. Accordingly, each of the wires WR to be coupled to the semiconductor chip SCC and the wiring substrate PCB may also be bonded by the wedge bonding method.

<Sealing Step>

Figure 21:
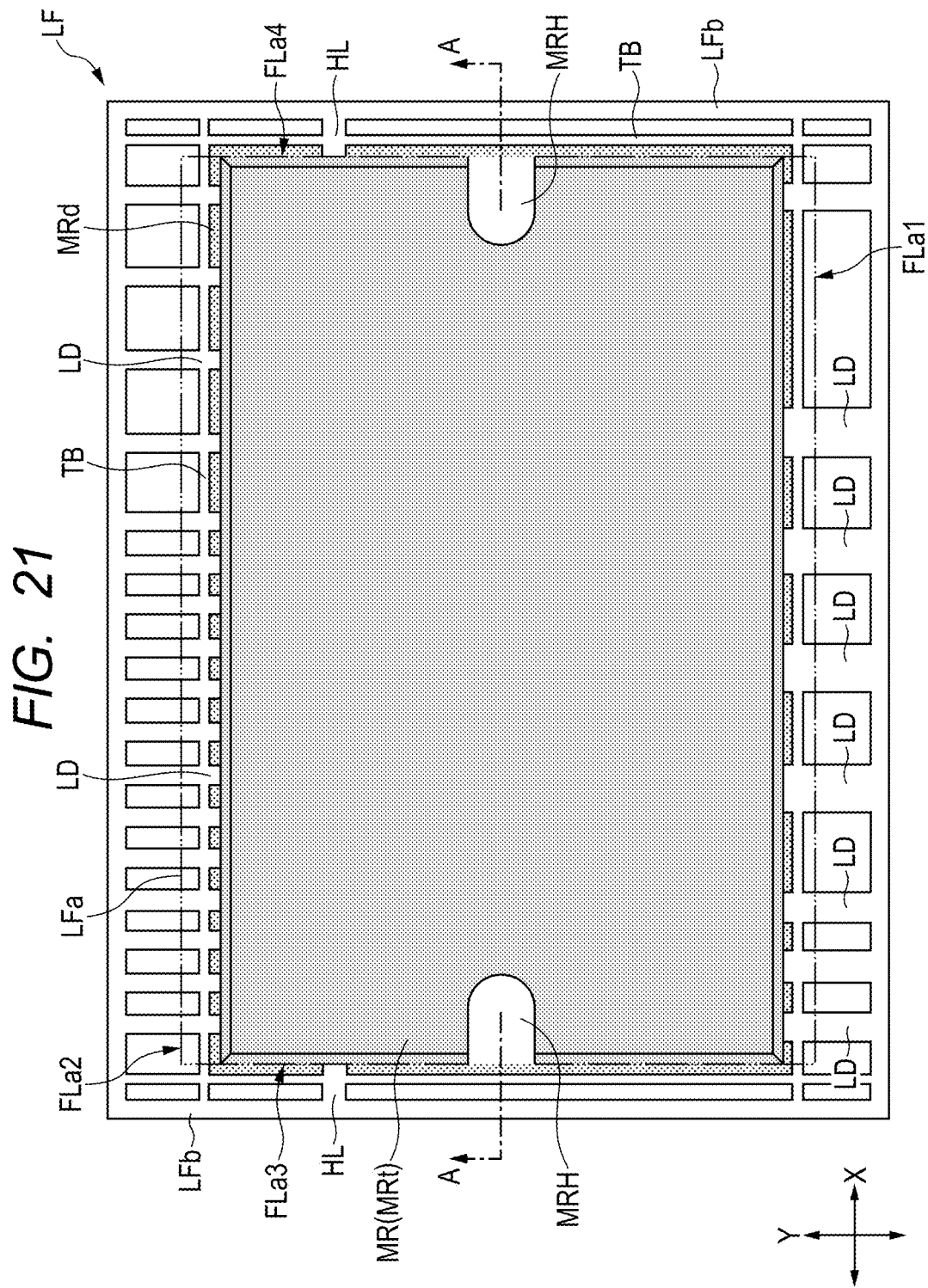
FIG. 21 is an enlarged plan view showing the state where the semiconductor chip shown in FIG. 20 is sealed with a resin.
Figure 22:
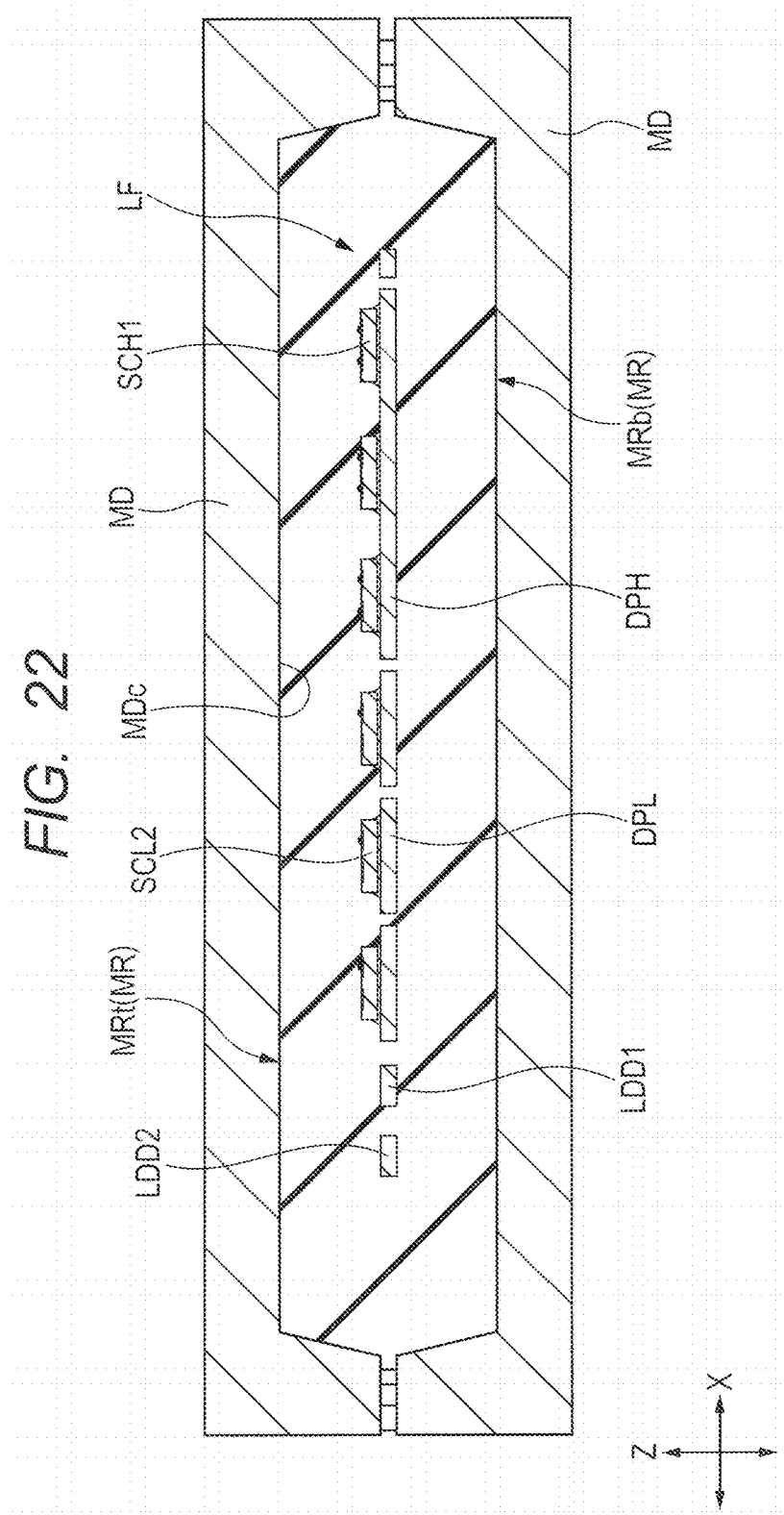
FIG. 22 is an enlarged cross-sectional view showing the state where, in a cross section along the line A-A in FIG. 21, a resin is supplied into a cavity with the lead frame being fixed in a molding die.

In the sealing step shown next in FIG. 17, each of the plurality of electronic components shown in FIG. 20, the plurality of wires, and the respective portions (inner lead portions) of the plurality of leads LD are sealed with a resin to form the sealing body MR shown in FIG. 21. FIG. 21 is an enlarged plan view showing the state where the semiconductor chip shown in FIG. 20 is sealed with a resin. FIG. 22 is an enlarged cross-sectional view showing the state where a resin is supplied into a cavity with the lead frame being fixed in a molding die in a cross section along the line A-A in FIG. 21.

In the present step, as shown in FIG. 22, the resin is supplied into the space formed by a cavity MDc in the state where the lead frame LF is placed in a molding die MD including the cavity MDc. Then, the foregoing resin is cured to thus form the sealing body (resin body) MR. Such a method of forming the sealing body MR is referred to as a transfer mold method.

In the transfer mold method, the resin is forcibly supplied under pressure into the cavity MDc. Accordingly, when the respective heights of the wire loops of the plurality of wires WR shown in FIG. 12 are high, the loop shapes of the wires WR may be deformed under the pressure of the supplied resin. However, in the case of the present embodiment, as described above, the resistive component CR1 is not interposed between the electronic components electrically coupled to each other via the wires WR. This allows reductions in the heights of the wire loops. Therefore, in the case of the present embodiment, even when the transfer mold method is used in the sealing step, it is possible to inhibit the wires WR from being deformed.

The cavity MDc of the molding die MD is located in the inner region of the device formation portion LFa (see FIG. 21) which is surrounded by the tie bar TB (see FIG. 21) in plan view. Accordingly, the main body portion of the sealing body MR is formed in the inner region of the device formation portion LFa which is surrounded by the tie bar TB. A portion of the resin that has leaked out of the cavity MDc is held back by the tie bar TB. Consequently, in the inner region of the tie bar TB, an in-dam resin MRd is formed, as shown in FIG. 21. Also, the respective portions (outer lead portions) of the plurality of leads LD which are located outside the tie bar TB are not sealed with the resin, but are exposed from the sealing body MR.

Note that, after the curing of the sealing body MR, each of the two openings MRH shown in FIG. 21 can be formed using a jig such as a drill. In another formation method, it may also be possible to attach columnar members corresponding to the openings MRH (see FIG. 21) to the molding die MD shown in FIG. 22. In this case, when the resin is supplied into the cavity MDc, the columnar members not shown avoid the resin. As a result, the sealing body MR in which the openings MRH are formed as shown in FIG. 21 can be obtained.

<Plating Step>

In the plating step shown next in FIG. 17, a metal film (outer lead frame plating film) is formed over the respective portions of the plurality of leads LD shown in FIG. 21 which are exposed from the sealing body MR. In the present step, the metal film made of, e.g., a solder is formed over the entire exposed surface of each of the leads LD. As a method for forming the metal film, an electrolytic plating method which precipitates metal ions resulting from ionization over the exposed surfaces of the leads LD can be used appropriately. The electrolytic plating method is preferable in terms of allowing the quality of the metal film to be easily controlled by controlling a current during the formation of the metal film. The electrolytic plating method is also preferable in terms of allowing a reduction in the time required to form the metal film.

<Marking Step>

Figure 23:
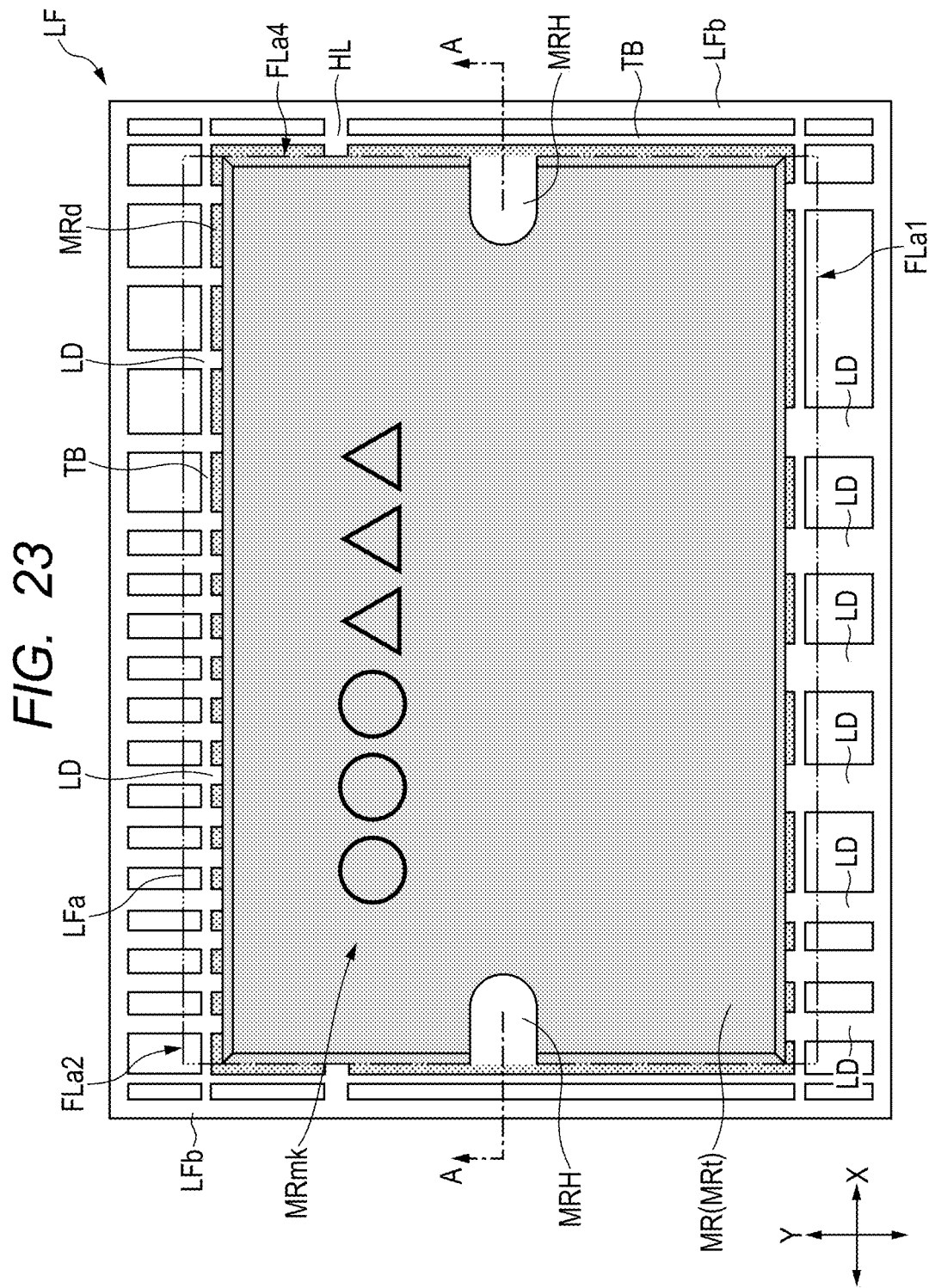
FIG. 23 is an enlarged plan view showing the state where a mark is formed on the upper surface of the sealing body shown in FIG. 21.

In a marking step shown next in FIG. 17, as shown in FIG. 23, information (mark MRmk) such as the name, model, or the like of a product is formed on the top surface of the sealing body MR made of the resin. FIG. 23 is an enlarged plan view showing the state where a mark is formed on the upper surface of the sealing body shown in FIG. 21. Note that, as a method for forming the mark, a method which prints the mark using a printing method or a method which inscribes the mark by irradiating the top surface of the sealing body with a laser can be used.

<Lead Cutting Step>

Figure 24:
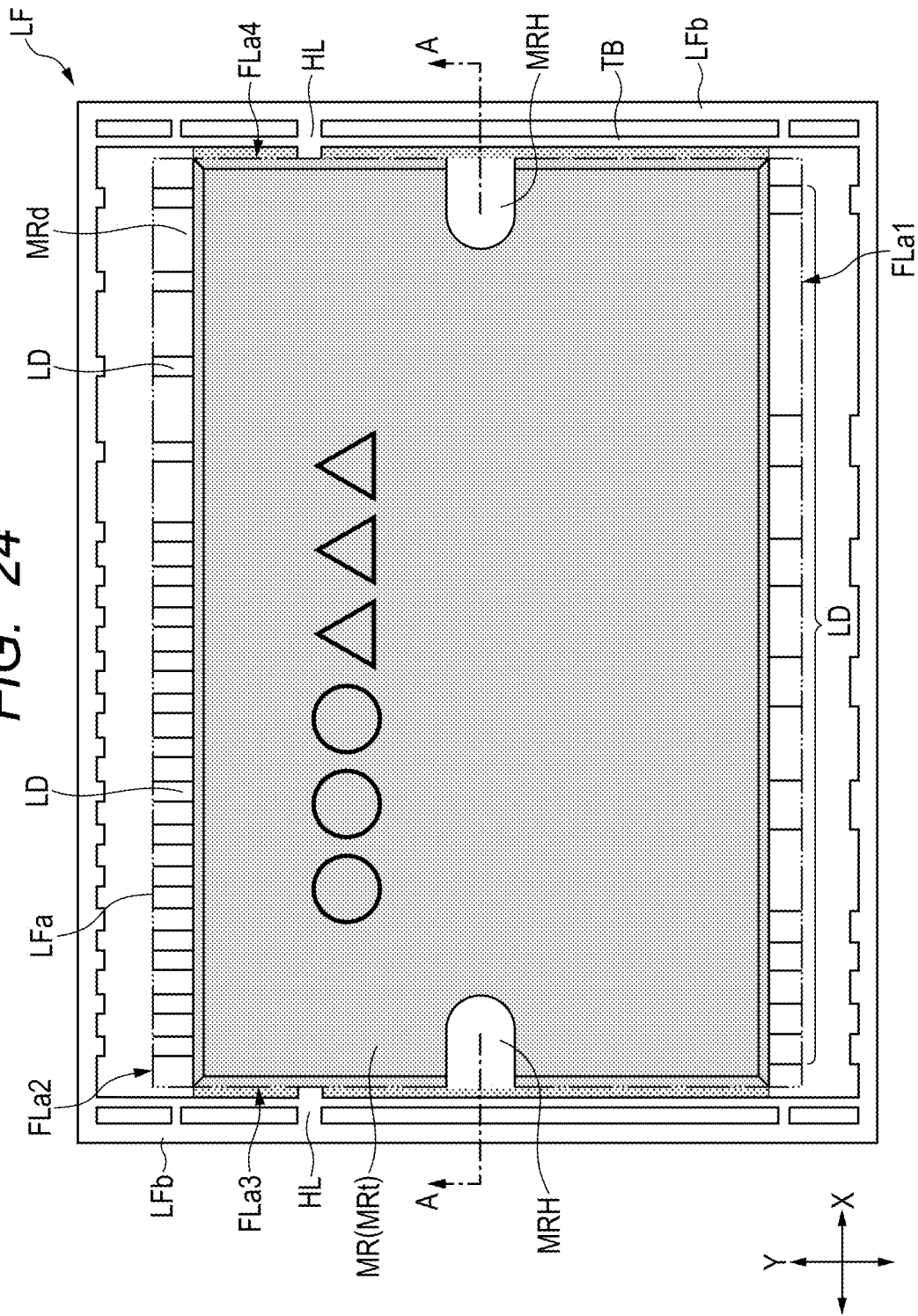
FIG. 24 is an enlarged plan view showing the state where the plurality of leads shown in FIG. 23 are cut and then shaped.

In a lead cutting step shown next in FIG. 17, as shown in FIG. 24, by cutting the respective outer lead portions of the plurality of leads LD, the plurality of leads LD are cut from the lead frame LF. FIG. 24 is an enlarged plan view showing the state where the plurality of leads shown in FIG. 23 are cut and then shaped. In the present embodiment, the plurality of leads LD are cut and then shaped to be bent as shown in FIG. 11.

In the present step, the tie bar TB (see FIG. 23) connecting the plurality of leads LD is cut. In addition, each of the plurality of leads LD is cut from the fame portion LFb. As a result, the plurality of leads LD become discrete members. After the plurality of leads LD are cut, a state is established in which the sealing body MR and the plurality of leads LD are supported by the frame portion LFb via the suspension leads HL.

Note that, in the description given in the present embodiment, the tie bar TB is cut after the foregoing plating step. However, the procedure may also be such that, after the tie bar TB is cut, the plating step is performed, and then each of the plurality of leads LD is cut from the frame portion LFb.

The plurality of leads LD and the tie bar TB are cut by press forming using, e.g., a cutting die not shown. After cut, the plurality of leads LD can be shaped as shown in, e.g., FIG. 11 by subjecting the outer lead portions of the plurality of leads LD to bending using press forming using, e.g., a molding die not shown.

<Singulation Step>

Next, in a singulation step shown in FIG. 17, the plurality of suspension leads HL shown in FIG. 24 and the tie bar TB coupled to the suspension leads HL are cut to separate the semiconductor packages from each other in the plurality of device formation portions LF1. In the present step, by cutting the plurality of suspension leads HL and the resin left in the corner portions of the sealing body MR, the semiconductor device PKG1 (specifically, a specimen before an inspection step) as the semiconductor package shown in FIG. 10 is acquired. A cutting method allows the cutting to be performed by, e.g., press forming using a cutting die not shown, in the same manner as in the foregoing lead shaping step.

After the present step, necessary inspections and tests such as an outer appearance test and an electric test are performed, and each of those determined to be acceptable becomes the semiconductor device PKG1 as a finished product shown in FIG. 10. Then, the semiconductor device PKG1 is shipped or mounted over a mounting substrate not shown.

While the invention achieved by the present inventors has been specifically described heretofore on the basis of the embodiment, the present invention is not limited to the foregoing embodiment. It will be appreciated that various changes and modifications can be made in the invention within the scope not departing from the gist thereof. Note that, while several modifications have been described in the foregoing embodiment, the following will describe typical modifications other than those described in the foregoing embodiment.

Modification 1

In the mode of implementation described using FIG. 12 in the foregoing embodiment, each of the HIGH-side power semiconductor chips is coupled to the semiconductor chip SCC via the wiring substrate PCB. However, there are various modifications of the number of the semiconductor chips mounted over the chip mounting portion DPC and the presence/absence of the wiring substrate PCB.

For example, in the example shown in FIG. 12, the description has been given of the mode of implementation in which the gate control circuit GC, the logic circuit LOG, and the detection circuit DTC each shown in FIG. 9 are formed integrally in the single semiconductor chip SCC. Among the foregoing circuits, the circuit which needs to be reduced in the distance therefrom to the resistive component CR1 is the detection circuit DTC. In terms of improving the accuracy of detecting a current, the respective distances from the gate control circuit GC and the logic circuit LOG to the resistive component CR1 may be long.

Accordingly, in a modification of FIG. 12, two semiconductor chips may be mounted over the chip mounting portion DPC. In this case, one of the semiconductor chips is a detection semiconductor chip including the detection circuit DTC shown in FIG. 9. The other of the semiconductor chips is a control semiconductor chip including the gate control circuit GC (and the logic circuit LOG). In this case, when the detection semiconductor chip is mounted to be located between the control semiconductor chip and the side MRs3 of the sealing body MR in plan view, the path length of the second transmission path described above can be reduced. The control semiconductor chip is mounted closer to the side MRs4 than the position of the semiconductor chip SCC shown in FIG. 12. In this case, the respective distances from the control semiconductor chip to the six power semiconductor chips can be set substantially equal. Accordingly, it may also be possible to directly couple each of the six power semiconductor chips directly to the control semiconductor chip via a wire without mounting the wiring substrate PCB.

However, in the case where the detection circuit DTC outputs a shut-down signal which halts the operation of the gate control circuit GC upon detection of an overcurrent, the transmission path for the shut-down signal is preferably shorter in terms of inhibiting the degradation of the shut-down signal. Accordingly, in terms of improving the reliability of transmission of the shut-down signal, the detection circuit DTC and the gate control circuit GC are preferably mounted over the same semiconductor chip SCC.

In the example shown in FIG. 12, a circuit layout is designed so as to minimize the two-dimensional size (area of the top surface SCt shown in FIG. 13) of the semiconductor chip SCC. However, when the sides SCs1 and SCs2 as the long sides of the semiconductor chip SCC shown in FIG. 13 are longer, a mode of implementation in which the wiring substrate PCB shown in FIG. 12 is not mounted and each of the six power semiconductor chips is coupled directly to the semiconductor chip SCC via a wire can also be considered. In this case, over the chip mounting portion DPC, only the semiconductor chip SCC having the long side SCs1 is mounted.

However, when the sides SCs1 and SCs2 as the long sides of the semiconductor chip SCC shown in FIG. 13 are extremely long, a stress is likely to be concentrated on the vicinity of the middle point of each of the long sides. Consequently, the semiconductor chip SCC may possibly be broken due to the stress resulting from a temperature cycle load or the like. Accordingly, in terms of improving the reliability of the semiconductor chip SCC, as shown in FIG. 12, a mode of implementation which uses the semiconductor chip SCC and the wiring substrate PCB is preferred.

In the case where the two-dimensional size (area of the top surface SCt shown in FIG. 13) of the semiconductor chip SCC is minimized, the number of the semiconductor chips SCC that can be acquired from a single semiconductor wafer increases. Accordingly, in terms of improving the manufacturing efficiency of the semiconductor chips SCC, the two-dimensional size of the semiconductor chip SCC is preferably minimized.

Modification 2

In the embodiment described above using FIGS. 12 and 15, the resistive component CR1 is disposed such that the long sides of the resistive component CR1 extend in the directions crossing the long sides of the sealing body MR. However, in a modification, the resistive component CR1 may also be disposed such that the long sides thereof are along the long sides of the sealing body MR. In this case, the path length of the transmission path including the lead LDD2 shown in FIG. 15 is longer than in the case shown in FIG. 15. However, the terminal NT coupled to the lead LDD2 is coupled to the ground potential. As a result, the noise influence exerted on the transmission path including the lead LDD2 is relatively smaller than that exerted on the transmission path including the lead LDD1.

However, when the path length of the transmission path including the lead LDD2 increases, the risk of noise contamination also increases. Accordingly, as shown in FIG. 15, the resistive component CR is preferably disposed such that the long sides thereof extend in the directions crossing the long sides of the sealing body MR.

Modification 3

In the embodiment described above using FIG. 15, the lead LDD1 is coupled to the component mounting portion EP1 over which the resistive component CR1 is mounted, the lead LDD2 is coupled to the component mounting portion EP2, and the wires WD are coupled to the leads LDD1 and LDD2. However, when the positions of the component mounting portions EP1 and EP2 are sufficiently close to the semiconductor chip SCC (FIG. 12), the wires WD may also be coupled directly to vacant regions of the component mounting portions EP1 and EP2.

However, in the case where the leads LDD1 and LDD2 are not provided, the distances over which the wires WD extend may be elongated. Accordingly, in terms of reducing the distances over which the wires WD extend, the leads LDD1 and LDD2 are preferably provided.

Modification 4

As shown in FIG. 15, the foregoing embodiment has described the mode of implementation in which the leads (inner leads) LDD1 and LDD2 are coupled to the component mounting portions (pads) EP1 and EP2. By changing the layout of the leads LDD1 and LDD2 as shown in the modification illustrated in FIG. 25, the measurement accuracy of the detection circuit DTC can further be improved. FIG. 25 is an enlarged plan view showing a modification of FIG. 15. FIG. 25 shows an equivalent circuit corresponding to the portion shown in FIG. 25. FIG. 25 is a plan view, but the leads LDD1 and LDD2 are hatched.

As shown in FIG. 25, the lead LDD1 is extracted from the component mounting portion EP1 toward the component mounting portion EP2. On the other hand, the lead LDD2 is extracted from the component mounting portion EP2 toward the component mounting portion EP1. In other words, the leads LDD1 and LDD2 are disposed so as to extend immediately under the resistive component CR1. The respective extracted portions of the leads LDD1 and LDD2 are located so as to extend along the center line connecting the respective centers of the electrodes RE1 and RE2 in plan view.

In the case of the modification shown in FIG. 25, as shown as an equivalent circuit in FIG. 25, it is possible to remove the component mounting portion EP1 and the resistance component thereof from the transmission path coupling the detection circuit DTC to the resistive component CR1. This allows the potential difference between the electrodes RE1 and RE2 to be accurately measured. As a result, it is possible to further improve the measurement accuracy of the detection circuit DTC.

Modification 5

Figure 26:
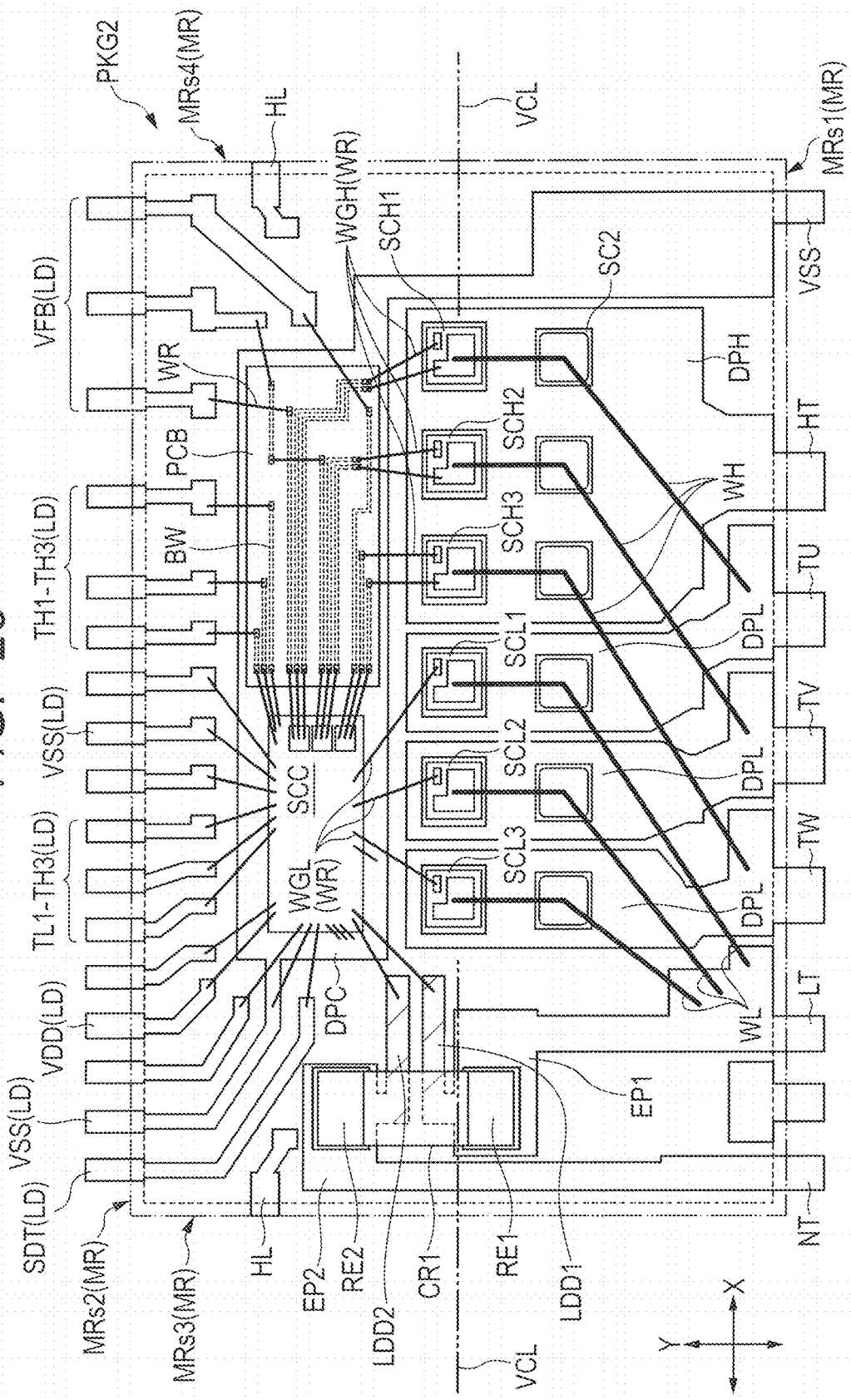
FIG. 26 is a plan view showing the inner structure of a semiconductor device in a modification of FIG. 12.

In the foregoing embodiment, as described using FIG. 12, the resistive component CR1 is disposed at the position closer to the side MRs1 of the sealing body MR than to the side MRs2 thereof. However, when attention is focused on a reduction in the distance between the resistive component CR1 and the semiconductor chip SCC as achieved in a semiconductor device PKG2 shown in FIG. 26, the resistive component CR1 can also be disposed at a position closer to the side MRs2 of the sealing body MR than to the side MRs1 thereof. FIG. 26 is a plan view showing an inner structure of the semiconductor device in a modification of FIG. 12. In FIG. 26, in the same manner as in FIG. 25, the leads LDD1 and LDD2 are hatched.

In the semiconductor device PKG2 shown in FIG. 26, the resistive component CR1 is closer to the side MRs2 of the sealing body MR than in the semiconductor device PKG1 shown in FIG. 12. In the example shown in FIG. 26, in plan view, the resistive component CR1 is disposed at a position overlapping the center line (virtual line) VCL connecting the respective middle points of the sides MRs3 and MRs4 as the short sides. Specifically, the electrode RE2 of the resistive component and more than half of the main body portion thereof are located between the side MRs2 and the center line VCL. On the other hand, the electrode RE1 of the resistive component and a part of the main body portion thereof are located between the side MRs1 and the center line VCL. In the example shown in FIG. 26, in plan view, the resistive component CR1 is placed over the extension line of the side SCs1 (see FIG. 13) as the long side of the semiconductor chip SCC.

The distance by which the semiconductor chip SCC and the resistive component CR1 are spaced apart can be set shorter in the semiconductor device PKG2 than in the semiconductor device PKG1 shown in FIG. 12. Accordingly, it is possible to reduce the distances over which the leads LDD1 and LDD2 extend. Depending on the layout of the tip portions of the leads LDD1 and LDD2, it is also possible to reduce the distances over which the wires WD (see FIG. 12) coupled to the leads LDD1 and LDDS2 extend.

In the case of the semiconductor device PKG2, in the same manner as in <Modification 4> described using FIG. 25, the leads LDD1 and LDD2 are extracted from the component mounting portions EP1 and EP2 so as to extend immediately under the resistive component CR1. Also, in the case of the semiconductor device PKG2, each of the leads LDD1 and LDD2 linearly extends from a position overlapping the resistive component CR1 in plan view along the X-direction. In this case, it is easy to equalize the lengths of the leads LDD1 and LDD2 (in other words, it is easy to provide equal lengths).

On the other hand, when attention is focused on the distance between each of the LOW-side power semiconductor chips and the resistive component CR1, i.e., the distance from the wire bonding region WBR (see FIG. 15) to which the wires WL shown in FIG. 15 are coupled to the resistive component CR1, the distance can be set shorter in the semiconductor device PKG1 shown in FIG. 12 than in the semiconductor device PKG2 shown in FIG. 26. In this case, it is possible to reduce the resistance component and the inductance component of a path coupling the LOW-side power semiconductor chip to the resistive component CR1. Therefore, in the semiconductor device PKG1, the accuracy of measuring a current can be improved compared to that in the semiconductor device PKG2.

When the length of the path coupling each of the LOW-side power semiconductor chips to the resistive component CR1 can be reduced, even though the shut resistor has a small resistance value, correct measurement can be performed. Consequently, in the semiconductor device PKG1, a power loss due to the shunt resistor can be reduced compared to that in the semiconductor device PKG2.

Also, in the case of the semiconductor device PKG2, since the resistive component CR1 is disposed at the position where the opening MRH shown in FIG. 12 is formed, the opening MRH cannot be formed at this position. Accordingly, the semiconductor device PKG1 shown in FIG. 12 is preferred to the semiconductor device PKG2 in that the opening MRH used to allow a screw to be inserted therethrough can be provided at the position overlapping the center line VCL.

Note that it is also possible to change the layout of the leads LD and thus allow the whole resistive component CR1 to be located between the center line VCL and the side MRs2, though the illustration thereof is omitted. In this case, the length of the path coupling each of the LOW-side power semiconductor chips to the resistive component CR1 is larger than in the semiconductor device PKG2 shown in FIG. 26. In addition, since it is necessary to change the layout of the leads LD, some of the plurality of leads LD arranged along the side MRs2 shown in FIG. 26 need to be disposed closer to the side MRs1. Alternatively, it is necessary to increase the two-dimensional size of the package.

Modification 6

In the example described in the foregoing embodiment, as each of the transistors Q1 included in the switching elements, the IGBT is used. However, in a modification, a power MOSFET may also be used for each of the switching elements of the inverter circuit. In the case of using the power MOSFET, in the semiconductor element included in each of the transistors, a body diode as a parasitic diode is formed. The body diode functions as the diode (free wheel diode) FWD shown in FIG. 7. Accordingly, when a semiconductor chip including the power MOSFET is used, the body diode is embedded in the semiconductor chip. As a result, in the case of using the power MOSFET, it is appropriate to use one semiconductor chip as one switching element.

In the case of using the power MOSFET for each of the switching elements of the inverter circuit, in the description given in the foregoing embodiment, the portion referred to as the emitter can be used appropriately as a source, while the portion referred to as the collector can be used appropriately as a drain. Accordingly, a repeated description is omitted herein.

Modification 7

Also, in the foregoing embodiment, as an example of the package structure of the semiconductor device, the DIP has been described. However, the technical idea in the embodiment and each of the modifications described above is not limited thereto and can also be applied to package structures such as SOP and SON.

Modification 8

In the example described in the foregoing embodiment, the semiconductor device PKG1 is formed of the electronic components included in the inverter circuit INV and the detection circuit DTC each shown in FIG. 1. However, the number of the electronic components included in the semiconductor device PKG1 has various modifications. For example, the semiconductor device PKG1 may also include an electronic component which implements an additional function.

Modification 9

Also, the foregoing embodiment has described the semiconductor device PKG1 in which, by way of example, the two openings MRH overlapping the center line VCL are formed in the sealing body MR, as shown in FIG. 10. However, the technical idea in the embodiment and each of the modifications described above is applicable to various modifications. For example, the technical idea is applicable to a semiconductor device in which the openings MRH shown in FIG. 10 are not formed. In this case, the design flexibility of the layout of the resistive component CR1 is improved to be able to further reduce the distance between the resistive component CR1 and the semiconductor chip SCC.

Modification 10

While the various modifications have been described heretofore, the individual modifications described above can be, e.g., combined to be used appropriately.

What is claimed is:

1. A semiconductor device, comprising:
a plurality of terminals including a first terminal coupled to a first potential, a second terminal coupled to a second potential lower than the first potential, and a third terminal coupled to a ground potential;
a plurality of first semiconductor chips each including a first power transistor coupled to the first terminal;
a plurality of second semiconductor chips each including a second power transistor coupled to the second terminal;
a resistive component including a first electrode electrically coupled to the second power transistor, a second electrode opposite to the first electrode, and a resistive element coupled to the first and second electrodes;
a third semiconductor chip including an amplification circuit electrically coupled to the first and second electrodes of the resistive component; and
a sealing body including a first long side extending in a first direction in plan view, a second long side opposite to the first long side in plan view, a first short side extending in a second direction crossing the first direction in plan view, and a second short side opposite to the first short side in plan view and sealing therein the first semiconductor chips, the second semiconductor chips, and the third semiconductor chip,
wherein, in the second direction, each of the first semiconductor chips and the second semiconductor chips is disposed at a position closer to the first long side of the sealing body than to the second long side thereof, while the third semiconductor chip is disposed at a position closer to the second long side of the sealing body than to the first long side thereof,
wherein, in the first direction, the resistive component is disposed at a position closer to the first short side than to the second short side of the sealing body, and
wherein the resistive component is arranged between the first short side of the sealing body and the second semiconductor chips in the first direction.

2. The semiconductor device according to claim 1,
wherein the first semiconductor chips are disposed at a position closer to the second short side than to the first short side of the sealing body in the first direction, and
wherein the first semiconductor chips are arranged between the second short side of the sealing body and the second semiconductor chips in the first direction.

3. The semiconductor device according to claim 2,
wherein the first semiconductor chips are arranged between the resistive component and the second semiconductor chips in the first direction.

4. The semiconductor device according to claim 3,
wherein, in plan view, a wiring substrate is disposed between the third semiconductor chip and the second short side of the sealing body, and
wherein the third semiconductor chip is coupled to a gate electrode of each of the first semiconductor chips via the wiring substrate.

5. A semiconductor device, comprising:
a plurality of first semiconductor chips each including a first surface, a first surface electrode exposed at the first surface, and a first power transistor coupled to the first surface electrode;
a plurality of second semiconductor chips each including a second surface, a second surface electrode exposed at the second surface, and a second power transistor coupled to the first surface electrode;
a first electronic component including a first electrode electrically coupled to the second power transistor, a second electrode opposite to the first electrode, and a resistive element coupled to the first and second electrodes;
a third semiconductor chip including a third surface, a plurality of third surface electrodes exposed at the third surface, and a first circuit electrically coupled to each of the first and second electrodes of the first electronic component via any of the third surface electrodes;
a first chip mounting portion over which the first semiconductor chips are mounted;
a second chip mounting portion over which the second semiconductor chips are mounted;
a third chip mounting portion over which the third semiconductor chip is mounted;
a sealing body having a first long side extending in a first direction in plan view, a second long side opposite to the first long side in plan view, a first short side extending in a second direction crossing the first direction in plan view, and a second short side opposite to the first short side in plan view and sealing therein the first semiconductor chips, the second semiconductor chips, the third semiconductor chip, the first electronic component, the first chip mounting portion, the second chip mounting portion, and the third chip mounting portion; and
a plurality of leads each coupled to any of the first semiconductor chips, the second semiconductor chips, the third semiconductor chip, and the first electronic component and having a portion thereof sealed in the sealing body and the other portion thereof exposed from one of the first and second long sides of the sealing body.

* * * * *